(12) United States Patent
Fujiwara et al.

(10) Patent No.: US 6,680,568 B2
(45) Date of Patent: Jan. 20, 2004

(54) LIGHT SOURCE

(75) Inventors: Tsubasa Fujiwara, Tokyo (JP); Akio Nakano, Tokyo (JP)

(73) Assignee: Nippon Leiz Corporation, Tokyo (JP)

( * ) Notice: Subject to any disclaimer, the term of this patent is extended or adjusted under 35 U.S.C. 154(b) by 104 days.

(21) Appl. No.: 09/937,847

(22) PCT Filed: Feb. 9, 2001

(86) PCT No.: PCT/JP01/00930

§ 371 (c)(1),
(2), (4) Date: Nov. 6, 2001

(87) PCT Pub. No.: WO01/59851

PCT Pub. Date: Aug. 16, 2001

(65) Prior Publication Data

US 2002/0153835 A1 Oct. 24, 2002

(30) Foreign Application Priority Data

Feb. 9, 2000 (JP) ..................................... 2000-032116
Nov. 15, 2000 (JP) ..................................... 2000-348383

(51) Int. Cl.[7] ............................................... H01J 1/62
(52) U.S. Cl. ...................................... 313/501; 313/512
(58) Field of Search .................................. 313/501, 512; 257/98, 99, 100

(56) References Cited

U.S. PATENT DOCUMENTS 4,942,504 A * 7/1990 Brotz ............................. 362/84
6,060,729 A    5/2000 Suzuki et al. ................. 251/99

FOREIGN PATENT DOCUMENTS

| JP | 60-261181  | 12/1985 |
| JP | 3048368    | 2/1998  |
| JP | 10-151794  | 6/1998  |
| JP | 10-308534  | 11/1998 |
| JP | 11-68166   | 3/1999  |
| JP | 11-87772   | 3/1999  |
| JP | 11-087778  | 3/1999  |
| JP | 11-121804  | 4/1999  |
| JP | 11-163419  | 6/1999  |
| JP | 2000-22222 | 1/2000  |
| JP | 2000-31530 | 1/2000  |

* cited by examiner

Primary Examiner—Renee Luebke
Assistant Examiner—Ann McCamey
(74) Attorney, Agent, or Firm—Kanesaka & Takeuchi

(57) ABSTRACT

A light emitting device effectively utilizes the light emanating from a semiconductor luminous element, and can acquire clear and high-luminance light emission without a color dapple. The light emitting device is configured as follows. A transparent resin containing a wavelength converting material is provided on a reflecting surface of a base member such as a case, a board and a lead frame. The transparent semiconductor luminous element is bonded and fixed on the transparent resin. A wavelength of light emitted from a lower surface of the semiconductor luminous element is converted by the wavelength converting material, and the converted light is reflected on the reflecting surface. The reflected light is mixed with light emitted from an upper surface of the semiconductor luminous element, and the mixed light is radiated.

13 Claims, 17 Drawing Sheets

FIG. 4

|  | CONVENTIONAL TYPE LUMINOUS INTENSITY (mcd) | TYPE IN THIS EMBODIMENT LUMINOUS INTENSITY (mcd) |
|---|---|---|
| No.01 | 53.8 | 64.3 |
| No.02 | 42.9 | 60.6 |
| No.03 | 45.6 | 61.1 |
| No.04 | 46.7 | 60.3 |
| No.05 | 44.1 | 58.2 |
| No.06 | 36.4 | 52.9 |
| No.07 | 44.6 | 61.0 |
| No.08 | 39.4 | 64.0 |
| No.09 | 42.4 | 53.6 |
| No.10 | 46.1 | 49.6 |
| No.11 | 51.2 | 60.6 |
| No.12 | 48.9 | 62.6 |
| No.13 | 40.5 | 62.8 |
| MAX | 53.8 | 64.3 |
| MIN | 36.4 | 49.2 |
| AVE. | 44.20 | 58.56 |

FIG.14
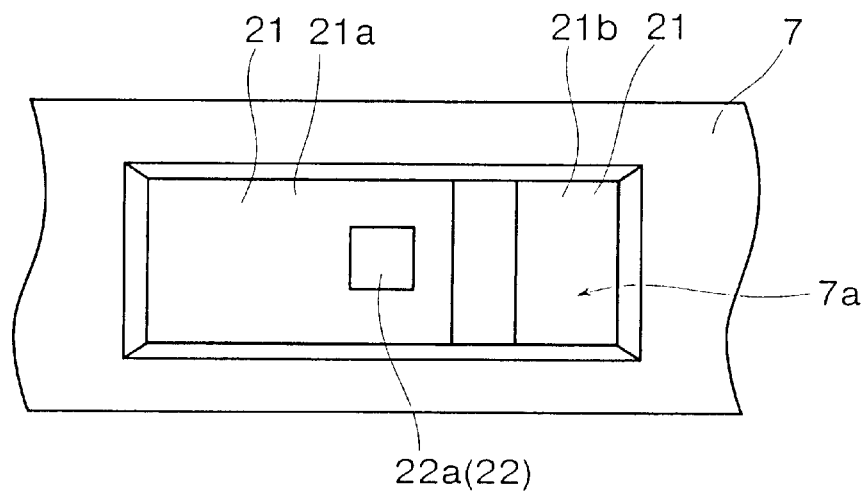
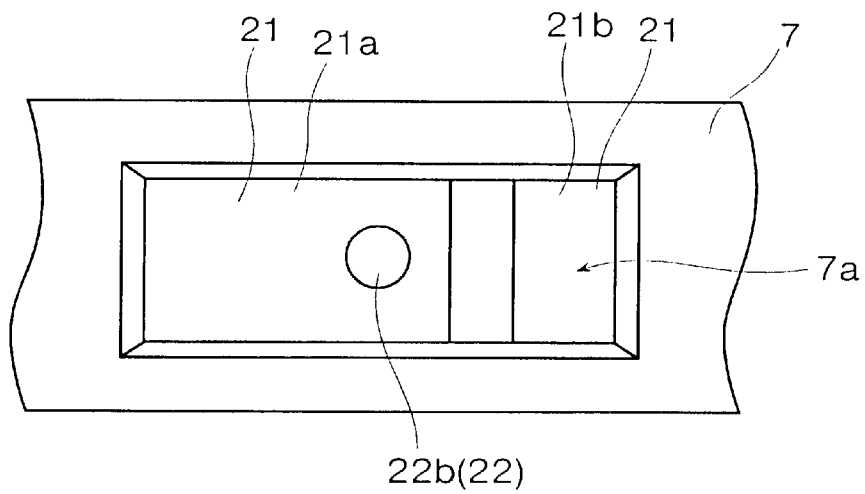
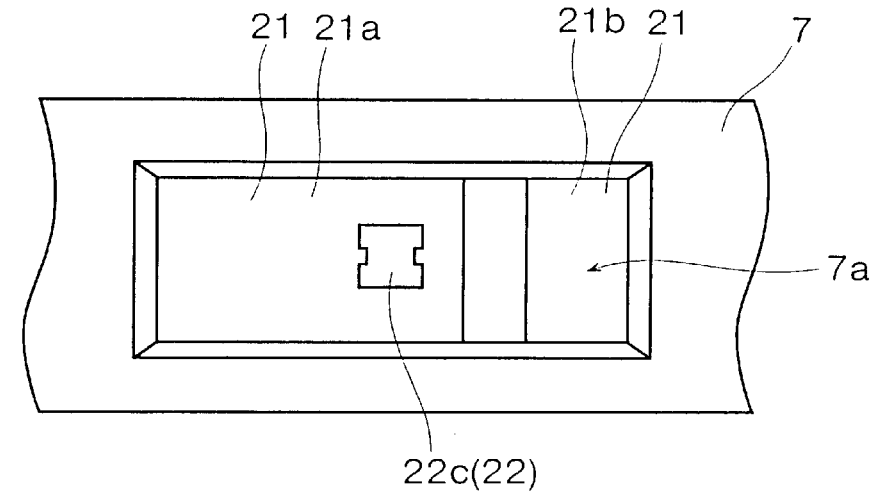

LIGHT SOURCE

BACKGROUND OF THE INVENTION AND RELATED ART STATEMENT

The present invention relates to a light emitting device used for a light source of a liquid crystal display and others. Particularly, the present invention relates to a light emitting device wherein clear and high-luminance emission without a color dapple can be acquired effectively utilizing the light emanating from a semiconductor luminous element for a long term.

A light emitting diode which is a semiconductor luminous element is a small device. Clear luminescent color can be efficiently acquired without anxiety that a light bulb is burnt-out. The light emitting diode has an excellent drive characteristic and is also strong against a vibration and repetitive switching operations. Therefore, the light emitting diode is utilized for a light source of various indicators and a liquid crystal display.

Heretofore, as a light emitting device of a liquid crystal display and others for displaying full color, a light emitting diode (LED) lamp is known. The LED lamp has semiconductor luminous elements emitting colors of red, blue and green, that is, three semiconductor luminous elements of so called RBG. The three semiconductor luminous elements are provided on a board as one unit.

Another type of full color light emitting device is also known. The full color light emitting device has three semiconductor luminous elements emitting colors of red, blue and green provided on a lead frame.

A light emitting diode used for this type of light emitting device has an excellent monochromatic peak wavelength. Therefore, in case that a light emitting device that emits white light is utilizing light emitting diodes that respectively emit red light, green light and blue light, for example, the light emitting diodes that respectively emit each color light are required to be arranged closely to diffuse and mix each color light.

Concretely, to acquire a light emitting device that emits white light, three types of red, green and blue light emitting diodes or two types of bluish green and yellow light emitting diodes are required. That is, to acquire a light emitting device that emits white light, light emitting diodes of plural types different in luminescent colors are required to be used.

In addition, a semiconductor light emitting diode chip has fluctuations in tone and luminance. In case that plural light emitting diodes are made of different materials, the driving power of each light emitting diode chip is different and a power source is required to be individually secured.

Therefore, to acquire the white light, a current supplied to every light emitting diode and others are required to be adjusted. There is a problem that a light emitting diode is different in temperature and aging characteristics, and tone also changes. Further, in case that the emission from each light emitting diode chip is not mixed uniformly, the light may include irregular color and desired white color may not be acquired.

Particularly, in the light emitting device wherein three types of semiconductor luminous elements of red, blue and green luminescent colors are provided on a board and are used as one unit, there is a problem that the light emitting device becomes large. In addition, as there is a distance between the semiconductor luminous elements, there is a problem that it is difficult to acquire uniform mixed color, and the color of the light emitting device becomes coarse.

In the light emitting device in which three types of semiconductor luminous elements of red, blue and green luminescent colors are provided on one lead frame and the like, to acquire the white luminescent color, charge is required to be supplied to all semiconductor luminous elements including red, blue and green. Therefore, there are a problem of large power consumption in view of energy conservation and a problem of a space required for a battery in a portable (mobile) type.

As a light emitting device in which the above-mentioned problems are solved, a light emitting device disclosed in Japanese published unexamined patent applications No. Hei 7-99345, No. Hei 10-190066 and No. Hei 10-242513 is known.

In the light emitting device disclosed in Japanese published unexamined patent application No. Hei 7-99345, an LED chip is mounted at the bottom of a cup. A resin (a color converting member) including a fluorescent material (or a filter material for partially absorbing the emission wavelength of the luminous chip) for converting the emission wavelength of the LED chip to another wavelength is filled inside the cup. Further, another resin is provided for surrounding the above-mentioned resin.

The light emitting device disclosed in Japanese published unexamined patent application No. Hei 10-190066 is provided with an LED chip fixed on a board by a die bonding member and a color converting member provided on the LED chip. The color converting member includes a fluorescent material that absorbs at least a part of light emitted from the LED chip, converts the wavelength and emits the converted light.

In a light emitting device disclosed in Japanese published unexamined patent application No. Hei 10-242513, a pair of mount-leads is provided in the light emitting device. A front edge of one of the mount-leads is in the form of a cup. An LED chip made of a gallium nitride semiconductor is arranged in the cup. The LED chip is electrically connected via an inner lead with the other mount-lead. A transparent resin including a fluorescent material is filled in the cup. In another light emitting device, a gallium nitride semiconductor chip is arranged in the body of the equipment and a transparent resin including a fluorescent material is filled in the body.

The light emitting device disclosed in the above-mentioned each patent application acquires another luminescent color from one type of luminescent color of a semiconductor luminous element itself. Concretely, as a light emitting diode that converts the wavelength of light emitted from an LED chip, white light emission is acquired by mixing light emitted from a blue light emitting diode and light emitted from a fluorescent material that absorbs the above-mentioned light and emits yellow light.

In the light emitting devices disclosed in the above-mentioned patent applications, the color converting member is provided on the LED chip. Therefore, in case that the white light is acquired, the dispersed blue light radiated upward from the LED chip itself and yellow light converted by the color converting member provided on the LED chip are mixed to look white light to a human eye.

To acquire clear and high-luminance white light, scattering and distribution of blue light and yellow light are required to be uniform and constant. However, in the configuration disclosed in the above-mentioned each patent application, the blue light is shielded by the color converting member on the LED chip. Luminance of the light emitting device is determined by a quantity of the light converted by the color converting member and the blue light radiated from the LED chip itself. Therefore, there is a problem that the scattering and the distribution of the color converting member are required to be uniform, and luminance is not satisfactory.

In addition to the color converting member including a fluorescent material for converting the wavelength of the light from the LED chip, a die bonding member (a mounting member) for fixing the luminous chip or the LED chip is required.

Further, the configuration disclosed in Japanese published unexamined patent application No. Hei 7-99345 has a problem that since the semiconductor luminous element is put in the wavelength converting material, it is difficult to acquire mixed color.

Also, in the configuration disclosed in Japanese published unexamined patent application No. Hei 10-242513, the gallium nitride semiconductor is arranged in the cup or the body of equipment. The fluorescent material such as a wavelength converting material is filled above the semiconductor and at the four sides. Hereby, the fluorescent material is uniformly dispersed in the transparent resin. In addition, there is a problem that it is difficult to control a dispersed quantity and a thickness at the four sides, and a dispersed quantity and a thickness above the surface. In addition to the configuration disclosed in the above-mentioned each patent application, there is also known another configuration. In the configuration, a blue light emitting semiconductor luminous element is enveloped in a shape of a lamp by the whole resin including a wavelength converting material. Hereby, white luminescent color can be acquired by the semiconductor luminous element lamp by converting the wavelength of light emitted from the semiconductor luminous element to another wavelength.

However, in the above-mentioned configuration, a quantity of the wavelength converting material is increased and the configuration has a problem in the stability of the scattering and the distribution of the wavelength converting material.

As described above, the light emission acquired in the case of the above-mentioned conventional type light emitting device is not enough as a light source for the liquid crystal display and others. Therefore, high-luminance light emission (particularly, white light emission) for a long term has been desired.

The invention is made to solve the above-mentioned problems. The invention has an object of effectively utilizing the light emanating from a semiconductor luminous element and acquiring clear and high-luminance light emission without a color dapple. The invention also has an object of providing light emitting device that enables acquiring high-luminance light emission for a long term compared with the conventional type.

SUMMARY OF THE INVENTION

A configuration of the invention to achieve the objects will be described below. A light emitting device according to the invention is provided on a reflecting surface of a base member (a board having reflectivity, a lead frame, and a pattern having reflectivity or an electric wiring pattern in a case), and includes a transparent resin in which a wavelength converting material is mixed and a transparent semiconductor luminous element provided on the transparent resin. In the light emitting device, a wavelength of light emitted from a lower surface of the semiconductor luminous element is converted by the wavelength converting material, and the light with the converted wavelength is reflected on the reflecting surface. The reflected light and light directly emitted from an upper surface of the semiconductor luminous element are mixed, and the mixed light is radiated from the upper surface of the semiconductor luminous element.

According to the light emitting device, light radiated downward from the lower surface of the semiconductor luminous element is reflected upward as the light with the wavelength converted by the wavelength converting material in the transparent resin. Hereby, the reflected light and light directly radiated from the semiconductor luminous element are completely mixed, and uniform light can be radiated upward from the upper surface of the semiconductor luminous element.

A conductive material may be further mixed in the transparent resin in addition to the wavelength converting material. When the semiconductor luminous element is bonded and fixed on the transparent resin, static electricity can be prevented from being electrified in the semiconductor luminous element itself.

The light emitting device according to a third aspect is characterized in that the transparent resin is formed in an area larger than an area of the semiconductor luminous element on the base member, and the semiconductor luminous element is bonded and fixed on the transparent resin on the base member.

According to the light emitting device, the light radiated downward from the lower surface of the semiconductor luminous element is reflected upward as the light with the wavelength converted by the wavelength converting material in the transparent resin. Further, light radiated downward from four sides of the semiconductor luminous element is reflected substantially upward as light with the wavelength converted by the wavelength converting material in the transparent resin provided in the area larger than the area of the semiconductor luminous element. The reflected light and light directly radiated from the semiconductor luminous element are completely mixed. Hereby, the uniform light can be radiated upward. The transparent resin is provided in the area larger than the area of the semiconductor luminous element. Hereby, when the wavelength converting material mixed in the transparent resin is applied or printed at a fixed and uniform thickness, mixed whole tone can be controlled not by the thickness but by the area. In addition, the transparent resin also functions as an adhesive and can fix the semiconductor luminous element.

A light emitting device according to a fourth aspect is characterized in that a concave portion is provided in the base member. The transparent resin is filled in the concave portion, and the semiconductor luminous element is bonded and fixed on the transparent resin filled in the concave portion.

According to the light emitting device, high-luminance light emission can be acquired, compared with a conventional type case that a transparent resin in which a fluorescent material is mixed is provided on a semiconductor luminous element. In addition, the semiconductor luminous element is bonded and fixed by the transparent resin filled in the concave portion. Therefore, the transparent resin also functions as an adhesive, so that it is possible to enhance and converge the light with the converted wavelength to be returned to the semiconductor luminous element.

A light emitting device according to a fifth aspect is characterized in that an aperture area of the concave portion is smaller than an area of the lower surface of the semiconductor luminous element.

According to the light emitting device, the direct light from the semiconductor luminous element and the light with the converted wavelength can be efficiently emitting outside.

A light emitting device according to a sixth aspect is characterized in that an inner wall of the concave portion faces the sides of the semiconductor luminous element and has an inclined face extending from the bottom to the aperture.

According to the light emitting device, the light radiated downward from the lower surface of the semiconductor luminous element is reflected upward as the light with the wavelength converted by the wavelength converting material in transparent resin. Further, the light is radiated from the four sides of the semiconductor luminous element sideway and downward. The radiated light is securely reflected substantially upward as the light with the wavelength converted by the wavelength converting material in the transparent resin formed on the inclined face at each position corresponding to the four sides of the semiconductor luminous element. The reflected light and light radiated directly from the semiconductor luminous element are completely mixed. Hereby, the uniform light can be radiated upward.

A light emitting device according to a seventh aspect is characterized in that an angle between the inclined face of the concave portion and the bottom of the concave portion is between 0° and 45°.

According to the light emitting device, the light emanating sideway from the four sides of the semiconductor luminous element is reflected substantially upward. The light emanating slightly diagonally downward is reflected upward substantially toward inside of the semiconductor luminous element. The light emanating slightly diagonally upward is reflected upward toward outside of the semiconductor luminous element. Therefore, the light emanating from the four sides of the semiconductor luminous element can be effectively utilized.

A shape of the aperture of the concave portion in the light emitting device may be rectangular or circular depending upon a shape of the semiconductor luminous element. Hereby, the light from the lower surface of the semiconductor luminous element can be effectively projected onto the concave portion, and the machining is also easy.

In case that the concave portion is machined by etching, a laser beam or electric discharge, it is possible to precisely form the aperture in a small shape with good reflection efficiency. Therefore, the concave portion smaller than the size of the lower surface of the semiconductor luminous element can be provided.

The semiconductor luminous element may be also bonded and fixed on the transparent resin via a transparent adhesive. In this case, it is desirable that the semiconductor luminous element has an active layer arranged on a transparent substrate and a transparent electrode is provided on the active layer.

The base member used in the light emitting device may be a ceramic board, a liquid crystal polymer resin board and a glass fiber epoxy resin board, a lead frame and a case having reflectivity. Hereby, independent of a place and a material, the semiconductor luminous element is bonded and fixed anywhere and arbitrary mixed light such as white light can be acquired.

The semiconductor luminous element may be formed of InGaAlP, InGaAlN, InGaN or GaN. Hereby, the desired mixed light can be acquired depending upon a combination with the wavelength converting material mixed in the transparent resin.

In the light emitting device according to the invention, if the wavelength converting material mixed in the transparent resin is evenly distributed without being dispersed two-dimensionally, the light emanating from the semiconductor luminous element can be further effectively utilized, compared with the conventional type configuration in which the transparent resin with the fluorescent material is filled on the semiconductor luminous element at random.

BRIEF DESCRIPTION OF THE DRAWINGS

FIG. 4 shows a result of the comparison in measured luminous intensities between a conventional type configuration in which a transparent resin with a fluorescent material is provided on a semiconductor luminous element and a configuration according to the invention (light emitting device of the first embodiment) in which a transparent resin with a fluorescent material is bonded and fixed under a semiconductor luminous element or a semiconductor luminous element is mounted (bonded) on a transparent resin with a fluorescent material;

FIGS. 14(a) to 14(c) are front views showing concave portions provided in a lead frame or a board formed by injection molding in the light emitting device equivalent to the eighth embodiment;

DETAILED DESCRIPTION OF PREFERRED EMBODIMENTS

Embodiment 1

Referring to the attached drawings, the invention will be described in more detail below.

A light emitting device according to the invention described below is using a transparent InGaAlP, InGaAlN, InGaN or GaN semiconductor luminous element. The semiconductor luminous element is mounted on a reflective lead frame, a reflective board or a reflective pattern and a reflective electric wiring pattern through a transparent resin in which a wavelength converting material is mixed.

Figure 1:
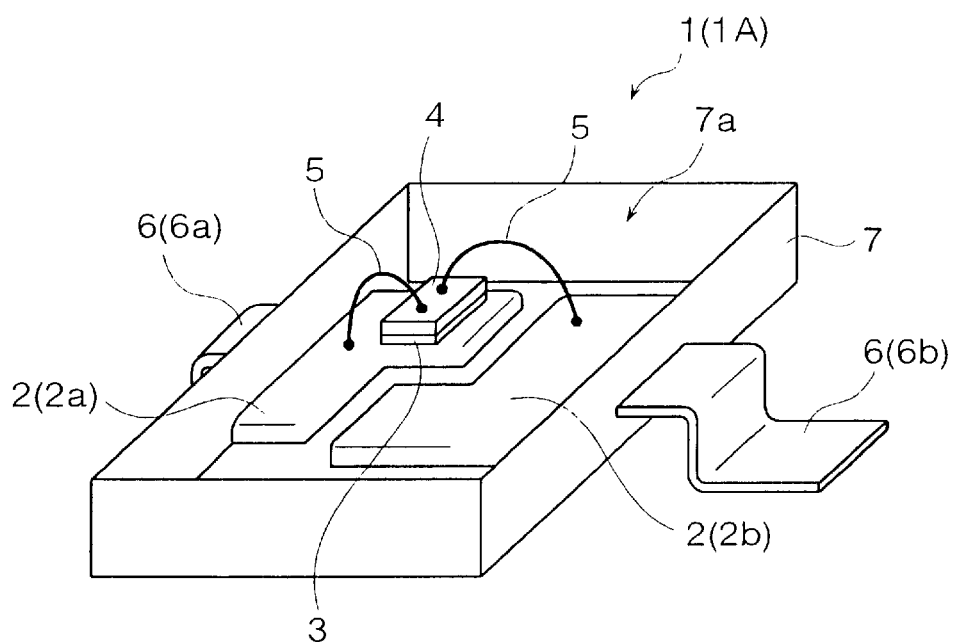
FIG. 1 is a general drawing showing a first embodiment of a light emitting device according to the invention.
Figure 2:
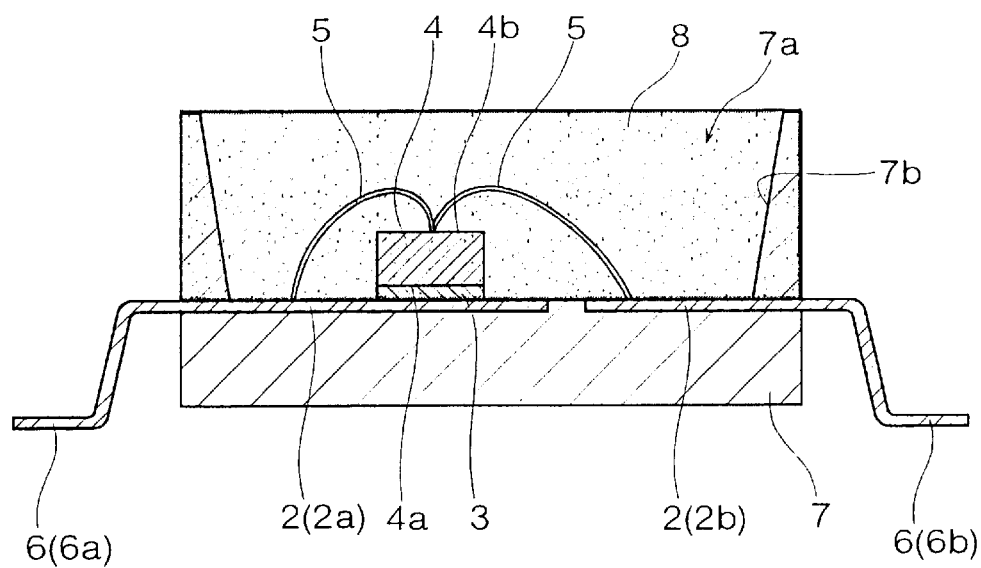
FIG. 2 is a side sectional view of FIG. 1.

FIG. 1 is a general drawing showing a first embodiment of the light emitting device according to the invention. FIG. 2 is a side sectional view of FIG. 1.

A light emitting device 1 (1A) equivalent to the first embodiment shown in FIGS. 1 and 2 is formed by injection moulding or transfer moulding. This light emitting device 1A is substantially composed of a pattern 2 (2a, 2b), a transparent resin 3, a semiconductor luminous element 4, bonding wires (hereinafter called wire) 5, lead terminals 6 (6a, 6b) and a molding case (hereinafter called a case) 7. The pattern 2 in this embodiment also includes an electric wiring pattern.

The pattern 2 (2a, 2b) is formed on a lead frame having a predetermined pattern form and made of phosphor bronze and others. The case 7 made of a resin is inserted into the lead frame.

The transparent resin 3 is acquired by mixing the wavelength converting material such as an inorganic fluorescent pigment and organic fluorescent dye in a transparent and colorless epoxy resin and others. In case that the fluorescent material (YAG) is mixed in the epoxy resin, for example, the weight ratio of the epoxy resin and the fluorescent material is approximately 1:3 to 1:4. This transparent resin 3 can be formed on the pattern 2 as a printed pattern by applying on the pattern 2 or by printing fluorescent material mixed ink and others.

The transparent resin 3 is provided between the pattern 2 exposed at the bottom in a concave portion 7a of the case 7 and the lower surface 4a (the surface without an electrode) of the semiconductor luminous element 4. In the example shown in FIGS. 1 and 2, the transparent resin 3 is provided in an area substantially similar to the lower surface 4a of the semiconductor luminous element 4. This transparent resin 3 also functions as an adhesive cement for sticking the semiconductor luminous element 4 on the pattern 2.

Further, in case that a semiconductor luminous element that emits blue light is used for the semiconductor luminous element 4, the transparent resin 3 is formed of a resin in which a wavelength converting material including an orange fluorescent pigment or an orange fluorescent dye such as Yttrium-Aluminum-Garnet (YAG) including $CaSiO_3$:Pb, Mn and $(Y, Gd)_3(Al, Ga)_5O_{12}$ is mixed. Hereby, yellow light is acquired by projecting the blue light from the semiconductor luminous element 4 onto the resin in which the wavelength converting material including the orange fluorescent pigment or the orange fluorescent dye is mixed. When the yellow light acquired by color conversion by the wavelength converting material in the transparent resin 3 and the blue light radiated by the semiconductor luminous element 4 itself are mixed, light radiated upward from the upper surface 4b of the semiconductor luminous element 4 itself becomes white light.

Also, in case that a semiconductor luminous element that emits green light, for example, is used for the semiconductor luminous element 4, the transparent resin 3 is formed of a resin in which a wavelength converting material including a red fluorescent pigment or a red fluorescent dye is mixed. Hereby, yellow light is acquired by projecting the green light from the semiconductor luminous element 4 onto the resin in which the wavelength converting material including the red fluorescent pigment or red fluorescent dye is mixed.

Further, in case that the transparent resin 3 is formed of a resin in which a wavelength converting material including a green fluorescent pigment or a green fluorescent dye is mixed, when a semiconductor luminous element that emits the blue light is used for the semiconductor luminous element 4, bluish green light is acquired by projecting the blue light from the semiconductor luminous element 4 onto the resin in which the wavelength converting material including the green fluorescent pigment or the green fluorescent dye is mixed.

The transparent resin 3 may be such a resin acquired by mixing a wavelength converting material including an inorganic fluorescent pigment or an organic fluorescent dye and others and a conductive material in the transparent and colorless epoxy resin.

The conductive material in this case is mixed at a limit at which a filler such as a silver particle does not have a negative effect upon the fluorescent material. The conductive material has a high resistance value at a degree at which the positive electrode and the negative electrode of the semiconductor luminous element 4 itself are not short-circuited at a low charge.

Even if potential static electricity and others higher than an applied voltage are electrified in the whole semiconductor luminous element 4, the static electricity and others are made to flow to the ground by adding a small amount of the conductive material in the case of the semiconductor luminous element 4 with high charge. Hereby, the InGaAlP, InGaAlN, InGaN or GaN semiconductor luminous element 4 itself which is sensitive to the static electricity is protected from the static electricity and others.

Concretely, a volume resistivity of the conductive material in the resin in which the fluorescent material is mixed is approximately 150 to 300 kΩ. A forward resistance of the semiconductor luminous element 4 is 165Ω and a peak inverse resistance thereof is 2.5 MΩ. Hereby, the resistance of the conductive material is a degree at which a current does not leak out into the semiconductor luminous element 4 and lower than the peak inverse resistance. Therefore, the current is made to flow to the ground and the static electricity can be prevented from being electrified in the semiconductor luminous element 4 itself.

The semiconductor luminous element 4 is formed of an InGaAlP, InGaAlN, InGaN or GaN semiconductor chip having a double hetero-structure with an active layer on an N-type board at the center and is manufactured by organometal vapor phase epitaxy.

Figure 3:
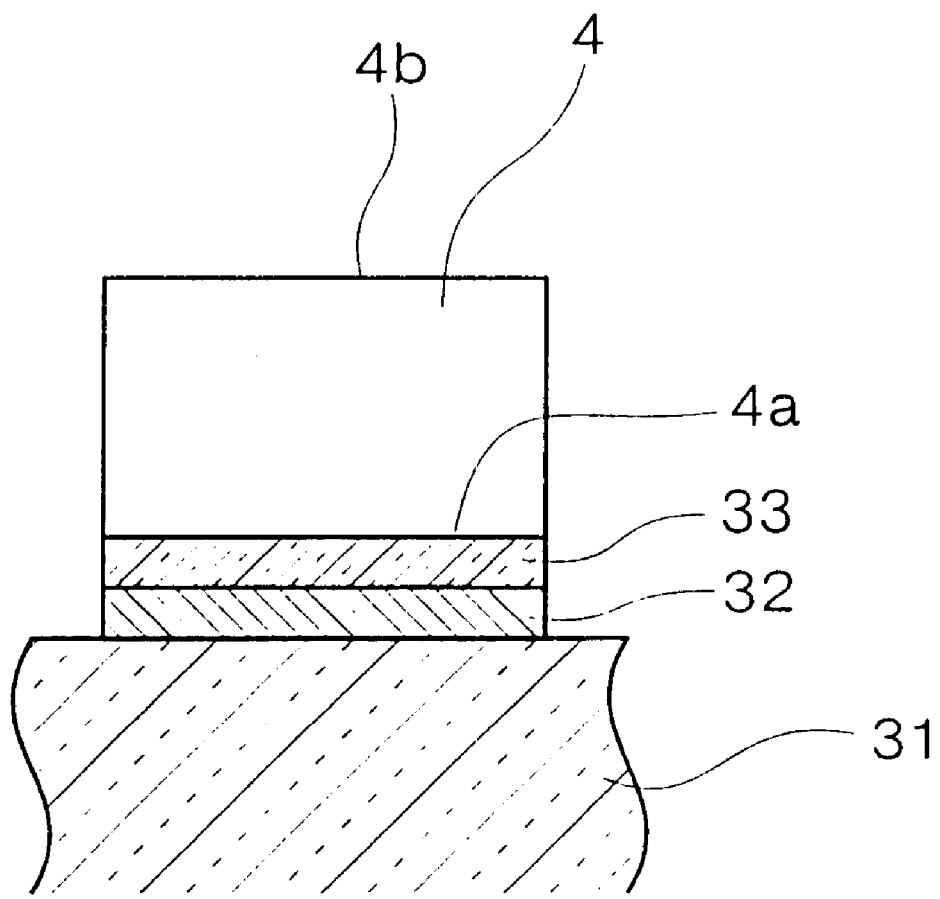
FIG. 3 shows a configuration of a semiconductor luminous element.

The board of the semiconductor luminous element 4 itself is a transparent board 31 made of $Al_2O_3$ or indium phosphide sapphire. As shown in FIG. 3, an active layer 32 is provided on the transparent board 31. A transparent electrode 33 is formed on the active layer 32. The electrode provided in the semiconductor luminous element 4 is produced by generating a conductive transparent electrode made of $In_2O_3$, $SnO_2$ or ITO with sputtering, vacuum evaporation or chemical vapor deposition.

The semiconductor luminous element 4 has an anode and a cathode on one surface (the upper surface 4b shown in FIG. 2). The other surface (the lower surface 4a shown in FIG. 2) without an electrode of the semiconductor luminous element 4 is mounted and fixed on the transparent resin 3. The anode and the cathode of the semiconductor luminous element 4 are respectively bonded to the patterns 2a and 2b by the wires 5.

The wires 5 are made of a conductive wire such as a gold wire. The wires 5 electrically connect the anode of the semiconductor luminous element 4 and the pattern 2a, and the cathode and the pattern 2b respectively through bonding.

The lead terminal 6 (6a, 6b) is formed by directly pulling a conductive and elastic lead frame made of a copper alloy such as phosphor bronze out of the case 7. The lead terminal 6a is electrically connected to the anode of the semiconductor luminous element 4 via the pattern 2a. Hereby, the lead terminal 6a is used as an anode (a positive electrode) of the light emitting device 1 (1A) according to the invention.

The lead terminal 6b is electrically connected to the cathode of the semiconductor luminous element 4 via the pattern 2b. Hereby, the lead terminal 6b is used as a cathode (a negative electrode) of the light emitting device 1 (1A) according to the invention.

The case 7 is molded in a concave form by mixing a white powder such as barium titanate in an insulating material such as a liquid crystal polymer made of modified polyamide, polybutylene terephthalate or aromatic polyester. The pattern 2 is exposed at the bottom of the concave portion 7a of this case 7.

The case 7 efficiently reflects the light from the side of the semiconductor luminous element 4 by the white powder such as barium titanate with excellent light reflectivity and a light shielding property. The case 7 emanates the reflected light upward by a tapered concave face 7b of the concave portion 7a shown in FIG. 2. The case 7 shields light so that the light emitted from the light emitting device 1 (1A) according to the invention does not leak outside.

Further, as shown in FIG. 2, in the concave portion 7a of the case 7, a colorless and transparent protective layer 8 made of an epoxy resin and others is filled to protect the pattern 2, the semiconductor luminous element 4, the wires 5 and others.

In the light emitting device 1 (1A) configured as described above, the semiconductor luminous element 4 that emits blue light is used. For the transparent resin 3, the resin in which the wavelength converting material (or wavelength converting material and conductive material) made of the orange fluorescent pigment or the orange fluorescent dye is mixed is used. Hereby, the clear and high-luminance white light can be acquired.

That is, the blue light is radiated upward from the semiconductor luminous element 4. The blue light radiated downward from the semiconductor luminous element 4 is converted to yellow light by the wavelength converting material in the transparent resin 3. The converted yellow light is radiated upward and downward from the transparent resin 3. The yellow light radiated downward from the transparent resin 3 is reflected on the surface of the pattern 2a under the transparent resin and is radiated upward. The blue light radiated by the semiconductor luminous element 4 itself and the yellow light converted by the wavelength converting material in the transparent resin 3 are mixed. Accordingly, the white light is radiated upward from the semiconductor luminous element 4.

The luminous intensity was measured to compare the conventional type configuration in which the transparent resin with the fluorescent material is provided on the semiconductor luminous element and the configuration according to the invention (the light emitting device equivalent to the first embodiment) in which the transparent resin with the fluorescent material is bonded and fixed under the semiconductor luminous element or in which the semiconductor luminous element is mounted (bonded) on the transparent resin with the fluorescent material. In this case, the light emitting devices were respectively installed in an element type (L1800), and the measurement was conducted under the following conditions. FIG. 4 shows a table including the result of the measurement.

Used chip: E1C10-1B001 (BL chip manufactured by Toyoda Gosei Co., Ltd.)

Fluorescent material: YAG81004 (manufactured by NEMOTO & CO., LTD),

Resin: Epoxy resin (same material used for the conventional type and the embodiment)

Specification: Conventional configuration (fluorescent material is provided on semiconductor luminous element), Configuration of the invention (fluorescent material is provided under semiconductor luminous element)

Measurement condition: Luminous intensity was measured when a current per chip was 10 mA A number of specimens: 13 pieces for each configuration Measurement equipment: LED tester As clear from the table shown in FIG. 4, it is found that in the configuration of the invention, an average luminous intensity is enhanced by approximately 32.5% as compared with that in the conventional configuration.

Embodiment 2

Figure 5:
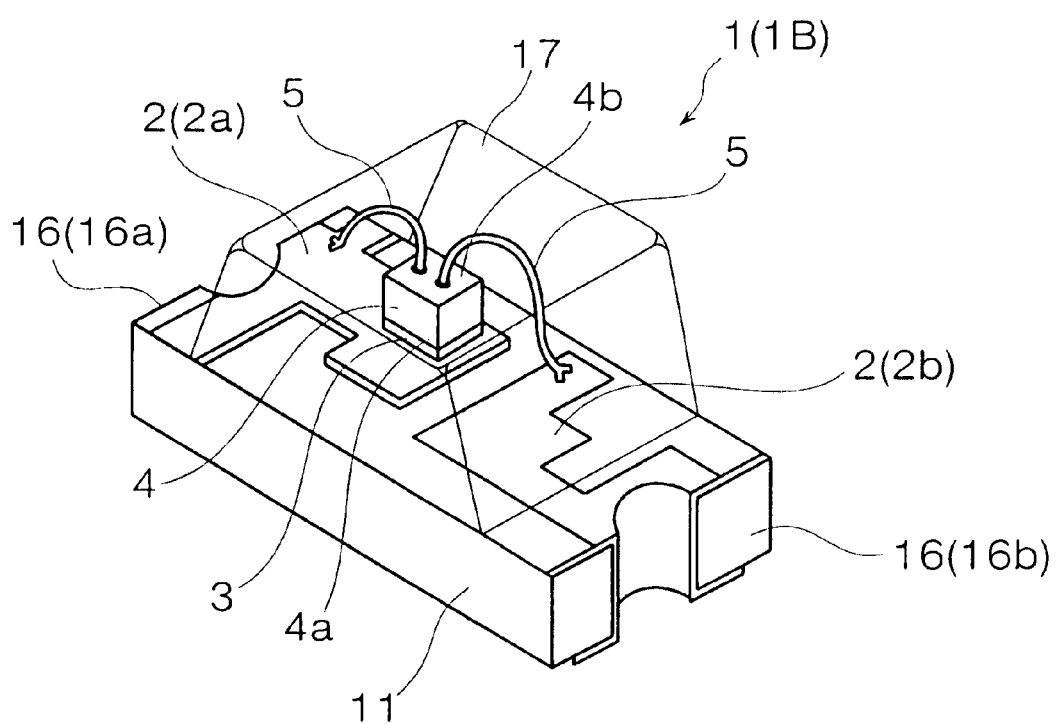
FIG. 5 is a general drawing showing a second embodiment of the light emitting device according to the invention.

FIG. 5 is a general drawing showing a second embodiment of the light emitting device according to the invention. The same numbers designate the components substantially similar to those of the light emitting device 1A equivalent to the first embodiment, and the detailed description is omitted.

A light emitting device 1B (1) equivalent to the second embodiment shown in FIG. 5 is a chip type. This light emitting device 1B is composed of a board 11, patterns 2 (2a, 2b), a transparent resin 3, a semiconductor luminous element 4, wires 5, terminal electrodes 16 (16a, 16b) and the light emanating mold 17. The patterns 2 in this embodiment also include an electric wiring pattern.

The board 11 is a board excellent in electric insulation, such as a ceramic board, a liquid crystal polymer resin board and a glass fiber epoxy resin board. The patterns 2 (2a, 2b) are formed on a surface of the board 11.

The board 11 made of a ceramic board for example is made of a compound having AlO or SiO as a principal component and further including ZrO, TiO, TiC, SiC or SiN. This ceramic board is excellent in heat resistance, hardness and strength, and has a white surface to efficiently reflect the light emitted from the semiconductor luminous element 4.

The board 11 made of a liquid crystal polymer resin or a glass fiber epoxy resin is formed by mixing or applying the white powder such as barium titanate with an insulating material such as a liquid crystal polymer and a glass fiber epoxy resin. Therefore, the light emitted from the semiconductor luminous element 4 is efficiently reflected.

For the board 11, pattern printing may be also applied to a laminated plate made of a silicon resin, paper epoxy resin, synthetic fiber epoxy resin and paper phenol resin, and a plate made of modified polyimide, polybutylene terephthalate, polycarbonate and aromatic polyester so as to efficiently reflect the light emitted from the semiconductor luminous element 4. In addition, metal such as aluminum may be also deposited and a film in which a metal foil is laminated or a sheet metal may be also stuck so as to provide a reflecting surface.

The patterns 2 (2a, 2b) are formed on the board 11 made of any of a ceramic, liquid crystal polymer resin and glass fiber epoxy resin by vacuum evaporation, sputtering, ion plating, chemical vapor deposition (CVD) and etching (wet etching, dry etching) in a shape of a pattern for electric connection. Further, after the metal plating is applied to the surfaces of the patterns 2, the plating of noble metal such as gold and silver is further applied, and the pattern is electrically connected to the terminal electrode 16 (16a, 16b).

The transparent resin 3 is provided between the patterns 2 on the board 11 and the lower surface 4a (the surface without an electrode) of the semiconductor luminous element 4. As shown in an example shown in FIG. 5, the transparent resin 3 is provided at the substantially similar area to the area of the lower surface 4a of the semiconductor luminous element 4. This transparent resin 3 also functions as an adhesive for sticking the semiconductor luminous element 4 to the pattern 2.

The semiconductor luminous element 4 has the anode and the cathode on one surface (the upper surface 4b shown in FIG. 5). The other surface without an electrode (the lower surface 4a shown in FIG. 5) is stuck by the transparent resin 3. The anode and the cathode of the semiconductor luminous element 4 are respectively bonded to the patterns 2a and 2b by the wires 5.

The terminal electrodes 16 (16a, 16b) are formed of thick plating metal with good electric conductivity at an end of the board 11, or mechanically attached conductive and elastic phosphor bronze and others.

The terminal electrode 16a is electrically connected to the anode of the semiconductor luminous element 4 via the pattern 2a. Hereby, the terminal electrode 16a is used as an anode (a positive electrode) of the light emitting device 1 (1B) according to the invention.

The terminal electrode 16b is electrically connected to the cathode of the semiconductor luminous element 4 via the pattern 2b. Hereby, the terminal electrode 16b is used as a cathode (a negative electrode) of the light emitting device 1 (1B) according to the invention.

The light emanating mold 17 is molded in a rectangular shape with the colorless and transparent epoxy resin. The light emanating mold 7 efficiently radiates the light from the luminescent surfaces (the upper surface and four sides) of the semiconductor luminous element 4. The light emanating mold 17 protects the patterns 2, the semiconductor luminous element 4 and the wires 5.

Though the light emanating mold 17 is not shown, it can be formed in a shape suitable for a purpose and a specification such as a dome for converging light in one direction.

In the light emitting device 1 (1B) configured as described above, the semiconductor luminous element 4 that emits the blue light is used. For the transparent resin 3, the resin in which the wavelength converting material (or wavelength converting material and conductive material) including the orange fluorescent pigment or the orange fluorescent dye is (are) mixed is used. Hereby, the clear and high-luminance white light can be acquired.

That is, the blue light is radiated upward from the semiconductor luminous element 4. The blue light radiated downward from the semiconductor luminous element 4 is converted to yellow light by the wavelength converting material in the transparent resin 3. The converted yellow light is radiated upward and downward from the transparent resin 3. The yellow light radiated downward from the transparent resin 3 is reflected on the surface of the lead 2a under the transparent resin, and is radiated upward. The blue light radiated from the semiconductor luminous element 4 itself and the yellow light converted by the wavelength converting material in the transparent resin 3 are mixed. Accordingly, the white light is radiated upward from the semiconductor luminous element 4.

Embodiment 3

Figure 6:
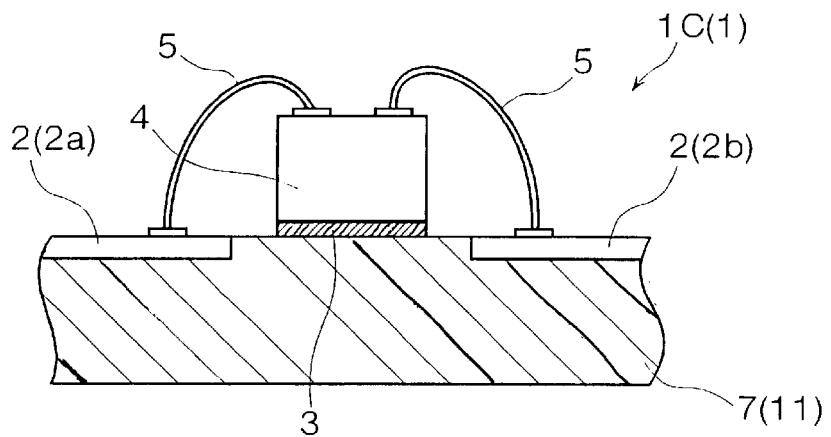
FIG. 6 is a partial sectional view showing a third embodiment of the light emitting device according to the invention.

FIG. 6 is a partial sectional view showing a third embodiment of the light emitting device according to the invention. The same numbers designate the components similar to those of the light emitting device 1A equivalent to the first embodiment and the light emitting device 1B equivalent to the second embodiment, and the detailed description is omitted.

In a light emitting device 1C (1) shown in FIG. 6, the semiconductor luminous element 4 is stuck via the transparent resin 3 at a portion of the case 7 or the board 11 at which the patterns 2 (2a, 2b) are not formed. Concretely, the semiconductor luminous element 4 is stuck via the transparent resin 3 at a portion between the pattern 2a and the pattern 2b (including an insulating pattern) respectively exposed at the bottom of the concave portion 7a of the case 7 or at a portion between the patterns 2a and 2b (including an insulating pattern) on the board 11. The anode and the cathode of the semiconductor luminous element 4 are respectively bonded to the patterns 2a and 2b by the wires 5.

Embodiment 4

Figure 7:
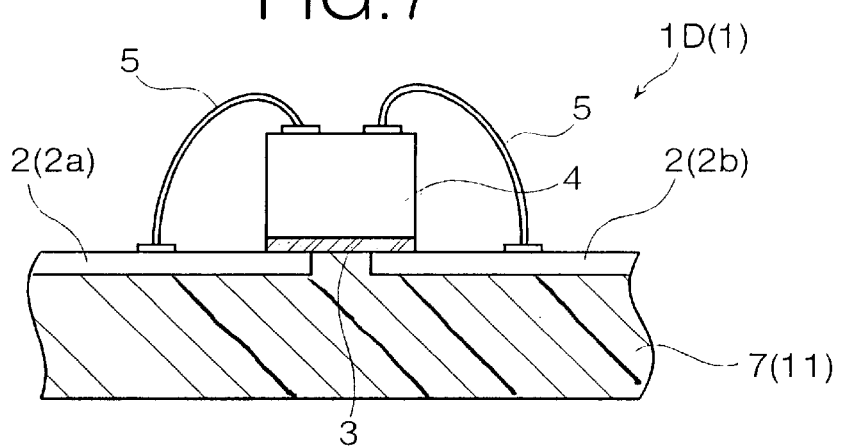
FIG. 7 is a partial sectional view showing a fourth embodiment of the light emitting device according to the invention.
Figure 8:
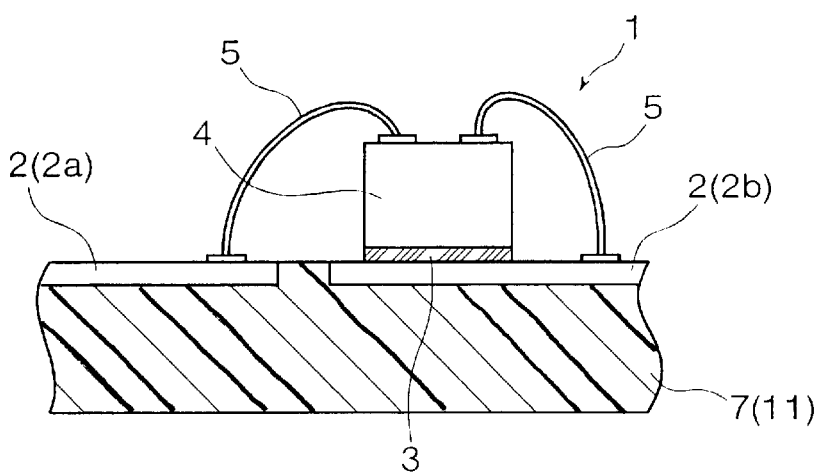
FIG. 8 is a partial sectional view showing a modified example of the light emitting device of the fourth embodiment.

FIG. 7 is a partial sectional view showing a fourth embodiment of the light emitting device according to the invention. FIG. 8 is a partial sectional view showing a modified example of the light emitting device equivalent to the fourth embodiment. The same numbers designate the components similar to those of the light emitting device 1A equivalent to the first embodiment and the light emitting device 1B equivalent to the second embodiment, and the detailed description is omitted.

In a light emitting device 1D (1) shown in FIG. 7, the semiconductor luminous element 4 is stuck via the transparent resin 3 across between the patterns 2a and 2b respectively exposed at the bottom of the concave portion 7a inside of the case 7, or across between the patterns 2a and 2b on the board 11. The anode and the cathode of the semiconductor luminous element 4 are respectively bonded to the patterns 2a and 2b by the wires 5. At that time, for the transparent resin 3, an insulating member in which the wavelength converting material not including the conductive material is mixed is used.

In case that the transparent resin in which the conductive material and wavelength converting material are mixed is used, the transparent resin 3 is mounted and grounded so that it is in contact with only a negative side of the patterns 2 as shown in FIG. 8, and the semiconductor luminous element 4 is stuck on the transparent resin 3.

Embodiment 5

Figure 9:
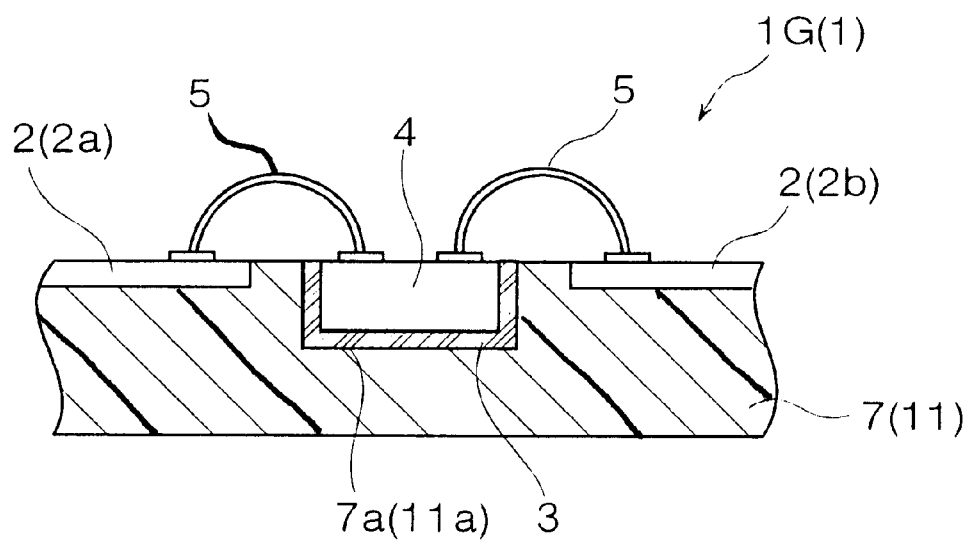
FIG. 9 is a general drawing showing a fifth embodiment of the light emitting device according to the invention.

FIG. 9 is a partial sectional view showing a fifth embodiment of the light emitting device according to the invention. The same numbers designate the components similar to those of the light emitting device 1A equivalent to the first embodiment and the light emitting device 1B equivalent to the second embodiment, and the detailed description is omitted.

In a light emitting device 1E (1) shown in FIG. 9, the semiconductor luminous element 4 is stuck via the transparent resin 3 in the concave portion 7a at a portion of the case 7 or the board 11 at which the patterns 2a, 2b are not formed. Concretely, the semiconductor luminous element 4 is stuck via the transparent resin 3 in the concave portion 7a of the case 7, or at the bottom and the peripheral surface of the concave portion 11a formed in the board 11.

The anode and the cathode of the semiconductor luminous element 4 are respectively bonded to the patterns 2a and 2b by the wires 5. According to this configuration, after the wavelength of the light radiated from the lower surface and four sides of the semiconductor luminous element 4 is converted via the transparent resin 3, it is reflected in the concave portion 7a or in the concave portion 11a, and is returned to the semiconductor luminous element 4 again. The light with the converted wavelength and the light from the semiconductor luminous element 4 itself are mixed and radiated from the upper surface 4b of the semiconductor luminous element 4.

Embodiment 6

Figure 10:
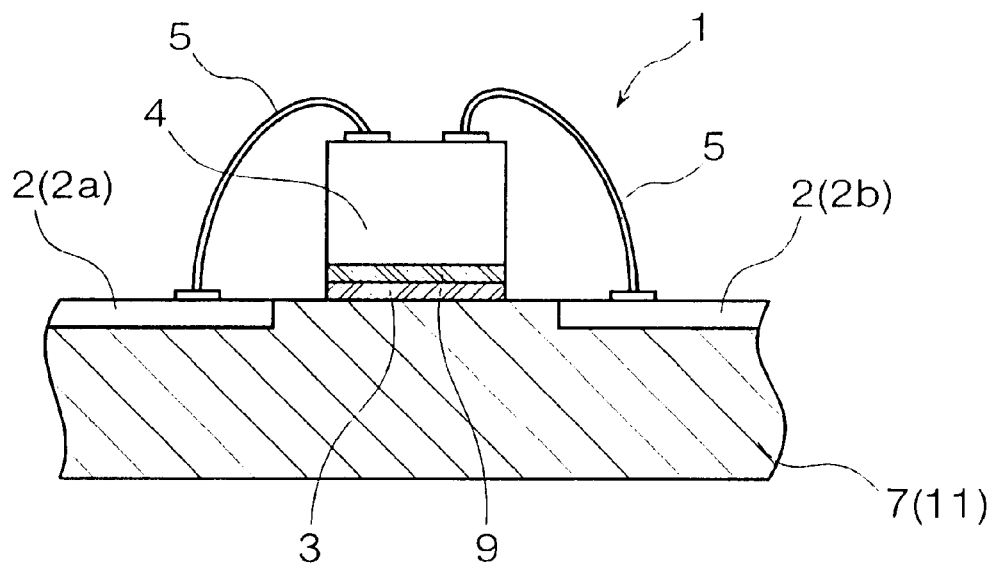
FIG. 10 is a partial sectional view showing a sixth embodiment of the light emitting device according to the invention.

FIG. 10 is a partial sectional view showing a sixth embodiment of the light emitting device according to the invention. The same numbers designate the components similar to those of the light emitting device 1A equivalent to the first embodiment and the light emitting device 1B equivalent to the second embodiment, and the detailed description is omitted.

A light emitting device 1F (1) shown in FIG. 10 is based upon the configuration of the light emitting device 1E shown in FIG. 9, and only the lower surface of the semiconductor luminous element 4 is stuck via the transparent resin 3 in the concave portion 7a of the case 7 or in the concave portion 11a of the board 11.

Embodiment 7

Figure 11:
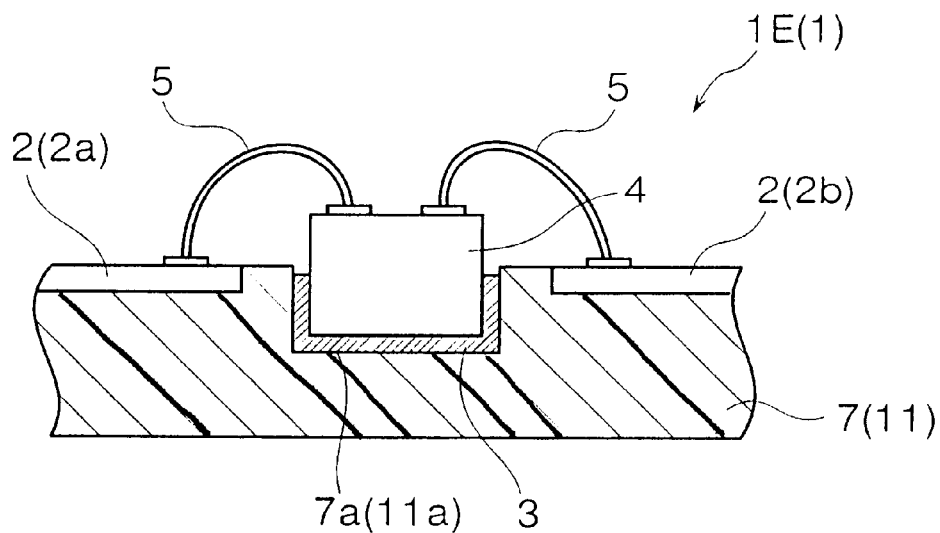
FIG. 11 is a partial sectional view showing a seventh embodiment of the light emitting device according to the invention.

FIG. 11 is a partial sectional view showing a seventh embodiment of the light emitting device according to the invention. The same numbers designate the components similar to those of the light emitting device 1A equivalent to the first embodiment and the light emitting device 1B equivalent to the second embodiment, and the detailed description is omitted.

Figure 12:
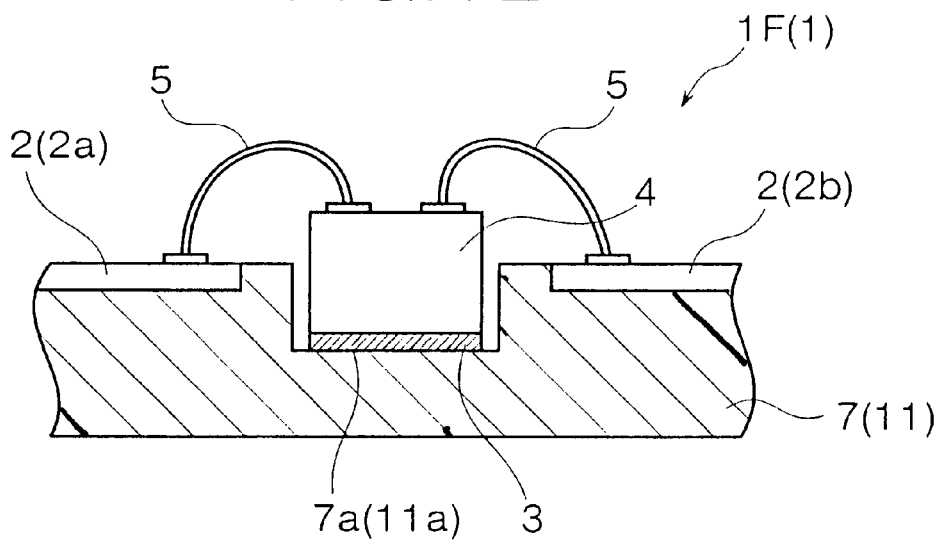
FIG. 12 is a partial sectional view showing a modified example of the light emitting device according to the invention.

A light emitting device 1G (1) shown in FIG. 11 is based upon the configuration of the light emitting device 1E shown in FIG. 9, and the semiconductor luminous element 4 is stuck via the transparent resin 3 so that the whole element is located in the concave portion 7a (or 11a). In the above-mentioned light emitting device, the transparent resin 3 also functions as an adhesive. As shown in FIG. 12, a transparent adhesive 9 is applied on the transparent resin 3, and the semiconductor luminous element 4 may be also fixed on the transparent adhesive 9.

At that time, the used transparent adhesive is made of liquid cyanoacrylate having a low viscosity. Hereby, different from an adhesive made of an epoxy resin, the semiconductor luminous element 4 can be instantaneously bonded and fixed without heat and a negative effect upon the semiconductor luminous element 4. In addition, no heat is required for the adhesive to harden and a bonding speed is fast, so the adhesive is advantageous in productivity and economy.

In FIG. 12, a configuration in which the transparent adhesive 9 is used in the light emitting device 1C equivalent to the third embodiment is shown, however, the configuration can be also applied to the light emitting device equivalent to another embodiment described in relation to this embodiment.

In case that the transparent resin acquired by mixing the wavelength converting material (wavelength converting material and conductive material) in a transparent adhesive made of cyanoacrylate having a high viscosity is used for the transparent resin 3, a printing process and a bonding process can be executed in a single step.

In case that the transparent resin 3 is formed of the resin in which the orange fluorescent pigment or the orange fluorescent dye is mixed in the above-mentioned configurations shown in FIGS. 6 to 12, and the semiconductor luminous element that emits the blue light is used for the semiconductor luminous element 4, the light radiated downward from the semiconductor luminous element 4 is converted to the yellow light by the wavelength converting material in the transparent resin 3. The yellow light is radiated to the semiconductor luminous element 4, and is also radiated downward, and then, the yellow light radiated downward is reflected at a lower portion (surface of the transparent resin 3 bonded to the case 7, the board 11, the pattern 2a and the like), and is returned to the semiconductor luminous element 4. Further, the yellow light is mixed with the blue light radiated directly upward from the semiconductor luminous element 4. Hereby, the white light can be radiated from the upper surface of the semiconductor luminous element 4.

Embodiment 8

Figure 13:
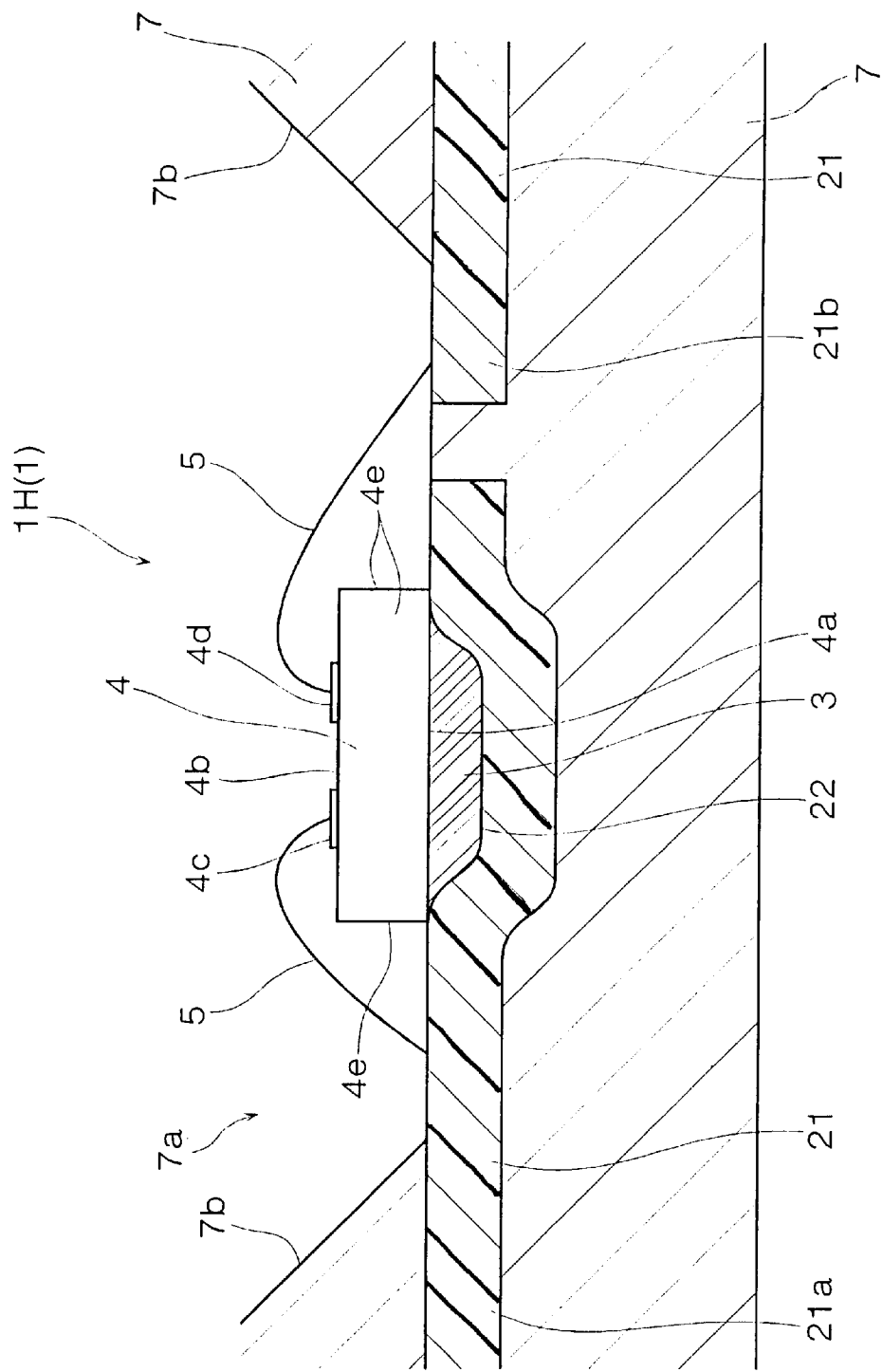
FIG. 13 is a partial sectional view showing an eighth embodiment of the light emitting device according to the invention.

FIG. 13 is a partial sectional view showing an eighth embodiment of the light emitting device according to the invention. FIGS. 14(a) to 14(c) are front views respectively showing a concave portion provided to a lead frame formed by injection molding or a board in the light emitting device equivalent to the eighth embodiment. The same numbers designate the components similar to those of the light emitting device 1A equivalent to the first embodiment and the light emitting device 1B equivalent to the second embodiment, and the detailed description is omitted.

A light emitting device 1H (1) shown in FIG. 13 is provided with a lead frame 21, the transparent resin 3, the semiconductor luminous element 4, the wires 5 and the case 7. The lead frame 21 is formed of a metallic thin plate made of conductive and elastic aluminum and others. The lead frame 21 is formed by a punching press in multiple units arranged in parallel in which one unit includes plural mounting patterns 21a for mounting the semiconductor luminous element 4, a wiring pattern 21b for electrically connecting to the semiconductor luminous element 4, plural lead terminals (not shown), and a supporting frame (not shown).

As shown in FIG. 13, in the mounting pattern 21a of the lead frame 21, a concave portion 22 having a size smaller than that of the lower surface 4a of the semiconductor luminous element 4 is minutely formed at a position in which the semiconductor luminous element 4 is mounted. The concave portion 22 is formed by etching, laser beam machining or electrical discharge machining.

In case that the phosphor bronze slightly inferior in reflectivity is used for the lead frame 21, the plating of silver and others is applied to the lead frame to enhance the reflection efficiency. The reason why the reflection efficiency is enhanced is that the light emanating from the lower surface 4a of the semiconductor luminous element 4 is reflected and is lead in the direction of the upper surface 4b of the semiconductor luminous element 4 or upward outside the sides 4e of the semiconductor luminous element 4 again.

The mounting pattern 21a of the lead frame 21 is connected to the anode (or the cathode) of the semiconductor luminous element 4 via the wire 5. The wiring pattern 21b of the lead frame 21 is a pattern for electric connection without mounting the semiconductor luminous element 4. The wiring pattern 21b is connected to the cathode (or the anode) of the semiconductor luminous element 4 via the wire 5.

The lead frame 21 is formed by the insertion molding of the bottom face of the mounting pattern 21a and the wiring pattern 21b into the case 7 so that the patterns are inserted symmetrically in a metallic mold (not shown).

The lead frame 21 is provided with a supporting frame (not shown) formed by insertion molding. The lead frame 21 holds the whole frame till a process including the mounting and bonding of a chip such as the semiconductor luminous element 4, the bonding of the wire 5 and the filling of the transparent resin 3. For the lead frame 21, only the lead terminal (not shown) is finally left and the rest is cut and removed.

The concave 22 is minutely worked by etching, laser beam machining or electrical discharge machining and is formed so that it is smaller than the size of the lower surface 4a of the semiconductor luminous element 4.

The concave portion 22 is respectively formed in a rectangular shape 22a shown in FIG. 14(a), in a circular shape 22b shown in FIG. 14(b), and in a shape of light 22c emitted from the lower surface 4a of the semiconductor luminous element 4 shown in FIG. 14(c). The transparent resin 3 is filled in the concave portion 22 and the semiconductor luminous element 4 is mounted on the transparent resin 3.

As shown FIG. 13, the chip of the semiconductor luminous element 4 is mounted on the transparent resin 3 filled in the concave portion 22. The wire 5 bonds the electrode 4c and the mounting pattern 21a of the lead frame 21. The wire 5 bonds the electrode 4d and the wiring pattern 21b of the lead frame 21. Hereby, electric connection is made.

Particularly, in case that the shape of the electrode of the semiconductor luminous element 4 is arranged around the right end and the left end of the chip, the transparent resin 3 is filled in the concave portion 22c shown in FIG. 14(c) and having the similar shape to the shape of light emission from the lower surface 4a of the semiconductor luminous element 4. The semiconductor luminous element 4 is mounted on the transparent resin 3.

In case that the conductive transparent metal such as $In_2O_3$, $SnO_2$ and ITO is formed as the electrodes (anode and cathode) 4c and 4d on the semiconductor luminous element 4 by a method such as sputtering, vacuum evaporation and chemical vapor deposition, the light from the lower surface 4a of the semiconductor luminous element 4 has a substantially rectangular shape. In this case, the transparent resin 3 is filled in the concave portion 22a shown in FIG. 14(a) and the semiconductor luminous element 4 may be also mounted on it. The transparent resin 3 is filled in the circular concave portion 22b shown in FIG. 14(b) depending upon quantity productivity and workability, and the semiconductor luminous element 4 may be also mounted on it.

The transparent resin 3 is filled in the concave portions 22 (22a, 22b, 22c) shown in FIGS. 14(a) to 14(c). The wavelength of the light emanating from the lower surface 4a of the semiconductor luminous element 4 is converted. The light with the converted wavelength is reflected at a metallic part of the concave portion 22. In the meantime, the light radiated downward from the semiconductor luminous element 4 is converted in color in the transparent resin 3. The light with the converted color is radiated upward toward the semiconductor luminous element 4 and is reflected at the lower portion (surface of the transparent resin 3 bonded to the case 7, the board 11 and the pattern 2a). The reflected light is also transmitted in the semiconductor luminous element 4 and is radiated upward toward the semiconductor luminous element 4. The radiated light is mixed with the light directly radiated upward from the semiconductor luminous element 4.

For example, in case that the semiconductor luminous element that emits the blue light is used for the semiconductor luminous element 4, and the resin with the wavelength converting material including the orange fluorescent pigment or the orange fluorescent dye is used for the transparent resin 3, the blue light radiated downward from the semiconductor luminous element 4 is converted to the yellow light in the transparent resin 3. The converted yellow light is radiated upward toward the semiconductor luminous element 4. Simultaneously, after the yellow light is radiated downward from the semiconductor luminous element 4, it is reflected at the bottom of the concave portion 22. The yellow light reflected at the concave portion 22 is also transmitted in the semiconductor luminous element 4 and is radiated upward toward the semiconductor luminous element 4. The yellow light directed to the semiconductor luminous element 4 and the blue light directly radiated upward from the semiconductor luminous element 4 in these two processes are completely mixed. Therefore, the uniform white light is radiated above the semiconductor luminous element 4. Hereby, the clear and high-luminance white light can be acquired.

As the luminescent color emitted from the semiconductor luminous element 4 through the epoxy resin of the transparent resin 3 and the luminescent color converted in the transparent resin 3 are mixed, color tone shown in a chromaticity diagram and the like can be adjusted through a mixing ratio in the colorless and transparent epoxy resin and a silicone resin.

For example, when the blue light from the semiconductor luminous element 4 is projected onto the transparent resin 3 in which the orange fluorescent pigment or the orange fluorescent dye is mixed, the white light is acquired by the mixture of the blue light and the orange light. In case that the transparent resin 3 is included in large quantity, light with deep orange tone is acquired. In case that the transparent resin 3 is included in a small quantity, light with deep blue tone is acquired. However, when a density distribution is large even if the transparent resin 3 is included by the same quantity, the quantity of the light with the converted wavelength returned to the semiconductor luminous element 4 increases. Therefore, most of the light radiated from the semiconductor luminous element 4 is the converted light from the transparent resin 3.

Accordingly, in the light emitting device 1H shown in FIG. 13, the concave portion 22 is provided to maintain the quantity of the transparent resin 3 including the wavelength converting material required for the white light, and the colorless and transparent epoxy resin and silicone resin are situated between particles of the wavelength converting material in the transparent resin 3. Hereby, the light with the wavelength converted in the transparent resin 3 reaches the bottom surface of the concave portion 22. The reflected light from the concave portion 22 passes between the particles of the wavelength converting material in the transparent resin 3. Therefore, the reflection effect is maintained by returning the reflected light to the semiconductor luminous element 4.

The wire 5 electrically connects the anode 4c of the semiconductor luminous element and the mounting pattern 21a with a bonder. Also, the wire 5 electrically connects the cathode 4d of the semiconductor luminous element 4 and the wiring pattern 21b with the bonder.

Though not shown, the lead frame 21 (21a, 21b) is connected to a lead terminal made of a conductive and elastic copper alloy such as phosphor bronze or aluminum to pull out it outside. In another configuration, the lead frame may be pulled as a lead terminal out of the case 7 encircling the whole device.

Further, the case 7 shown in FIGS. 14(a) to 14(c) is formed by injection molding, in which the lead frame 21 (21a, 21b) and others are inserted with a pressure.

In the above-mentioned example, it is described that the concave portion 22 (22a, 22b, 22c) is formed in the lead frame 21 (21a, 21b), the transparent resin 3 including the wavelength converting material is filled in the concave portion 22, and the semiconductor luminous element 4 is mounted on it. The same configuration is applied to the board having the reflecting surface at a portion at which the semiconductor luminous element 4 is mounted. In this case, the concave portion 22 having a size smaller than the size of the lower surface 4a of the semiconductor luminous element 4 is provided to the board. The transparent resin 3 including the wavelength converting material is filled in the concave portion 22. The semiconductor luminous element 4 is mounted on it.

However, in case that the board is used in place of the lead frame 21, when the board is made of an insulating material such as a glass fiber epoxy resin, for example, after the concave portion 22 is formed in the board by etching, laser beam machining or electrical discharge machining, the plating of silver and others is applied to the concave portion 22 and the reflecting surface is formed. Hereby, the reflection efficiency is enhanced.

An example of the light emitting device 1H equivalent to the eighth embodiment will be described below.

(Y, Gd)$_3$(Al, Ga)$_5$O$_{12}$:Ce was used as the fluorescent pigment of the YAG type. A ratio of the atomic weight of (Y, Gd)$_3$(Al, Ga)$_5$O$_{12}$ and Ce was changed. The fluorescent pigment used in the embodiment had a ratio of 1:4 and an average particle size of approximately 8 $\mu$m. The fluorescent pigment was mixed with the colorless and transparent epoxy resin at a ratio of 1:1 by weight. Hereby, the white light was acquired by mixing the orange luminescent color from the wavelength converting material and the blue luminescent color from the semiconductor luminous element.

In this example, higher average luminance was acquired in the case of the light emitting device 1H wherein the concave portion 22 is provided at a position at which the semiconductor luminous element 4 is mounted, and the transparent resin 3 is filled in the concave portion 22 at a constant quantity, compared with a case that the transparent resin 3 is applied to the semiconductor luminous element 4.

Embodiment 9

Figure 15:
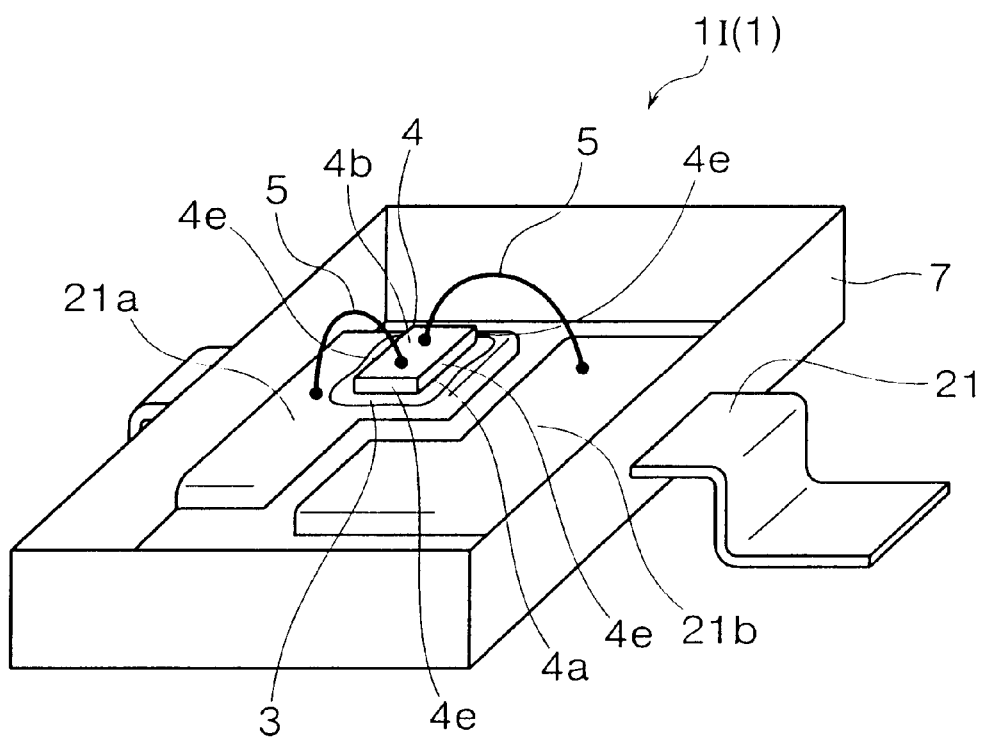
FIG. 15 is a perspective view showing a ninth embodiment of the light emitting device according to the invention.
Figure 16:
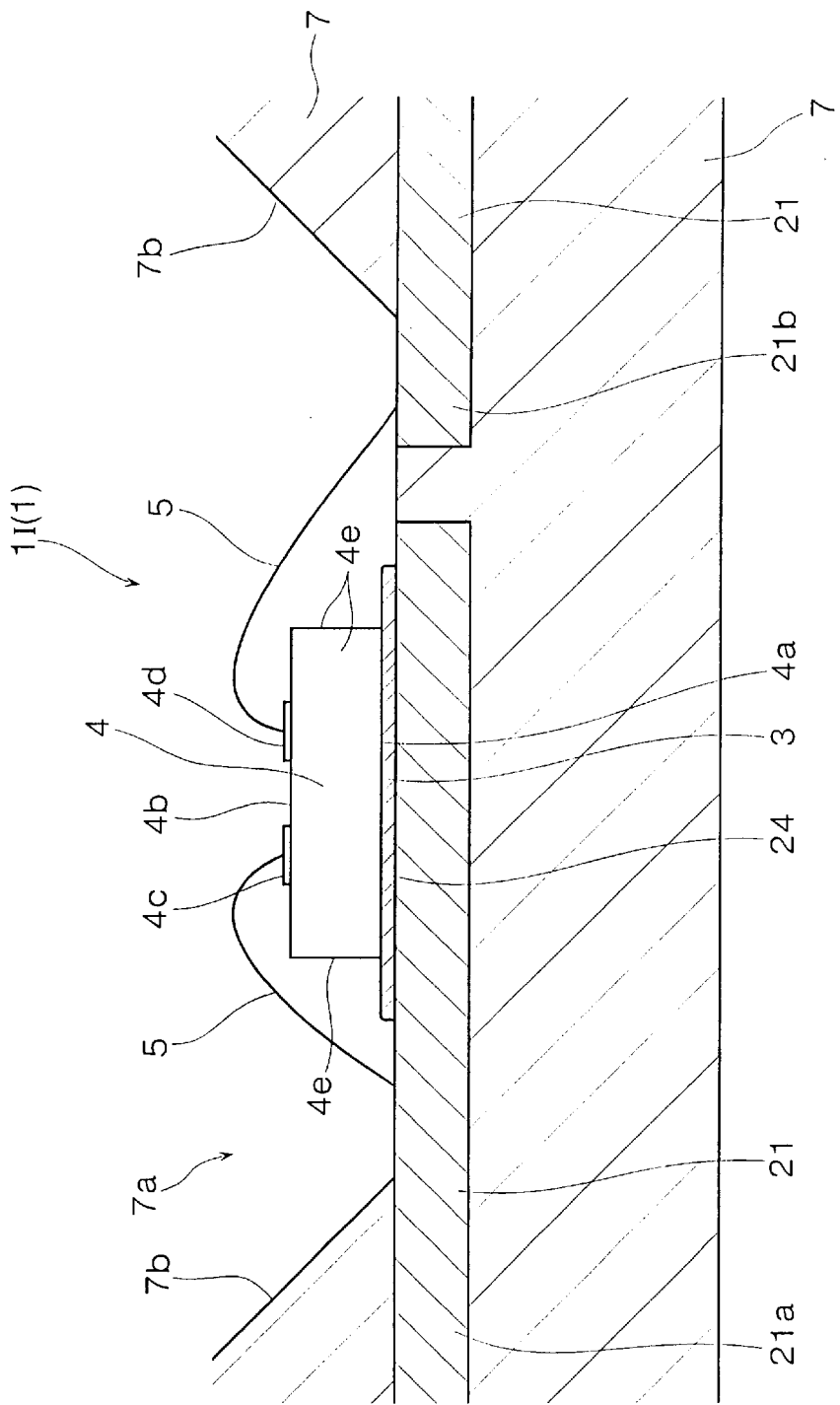
FIG. 16 is a partial side sectional view showing the light emitting device according to the ninth embodiment.

FIG. 15 is a schematic perspective view showing a ninth embodiment of the light emitting device according to the invention. FIG. 16 is a partial side sectional view showing the light emitting device equivalent to the ninth embodiment. The same numbers designate the components similar to those of the light emitting device 1H equivalent to the eighth embodiment, and the detailed description is omitted.

A light emitting device 1I (1) equivalent to the ninth embodiment shown in FIGS. 15 and 16 is provided with the lead frame 21, the transparent resin 3, the semiconductor luminous element 4 and the case 7.

The transparent resin 3 of the light emitting device 1I is maintained at a constant quantity by application or printing. The transparent resin 3 is provided on the lead frame 21 as shown in FIG. 15 in an area including an outside area of the semiconductor luminous element 4 larger than an area 24 in which the semiconductor luminous element 4 is mounted on the wiring pattern 21a (equivalent to an area of the lower surface 4a of the semiconductor luminous element 4). Hereby, the light radiated from the lower surface 4a of the semiconductor luminous element 4 can be more efficiently converted in color. Even if the quantity of the wavelength converting material by printing and others is small, optimum tone can be acquired.

The transparent resin 3 converts the wavelength of the light emanating from the lower surface 4a of the semiconductor luminous element 4. The light with the converted wavelength is radiated toward the semiconductor luminous element 4, and is also reflected at the lower portion (bonded surface between the wiring pattern 21a and the transparent resin 3). The reflected light is also radiated upward toward the semiconductor luminous element 4. The reflected light is mixed with the light directly radiated upward from the semiconductor luminous element 4.

For example, the semiconductor luminous element that emits the blue light is used for the semiconductor luminous element 4. The resin with the wavelength converting material including the orange fluorescent pigment or the orange fluorescent dye is used for the transparent resin 3. Hereby, the blue light radiated upward from the semiconductor luminous element 4 is converted to the yellow light in the transparent resin 3 by the wavelength conversion.

The converted yellow light is radiated toward the semiconductor luminous element 4 located on the transparent resin 3. Simultaneously, the yellow light is reflected on the wiring pattern 21a of the lead frame 21. The yellow light reflected on the wiring pattern 21a of the lead frame 21 is also radiated upward toward the semiconductor luminous element 4. The yellow light directed to the semiconductor luminous element 4 and the blue light directly radiated upward from the semiconductor luminous element 4 are completely mixed in these two processes. Therefore, the uniform white light is radiated from the upside of the semiconductor luminous element 4. Hereby, the clear and high-luminance white light can be acquired.

Embodiment 10

Figure 17:
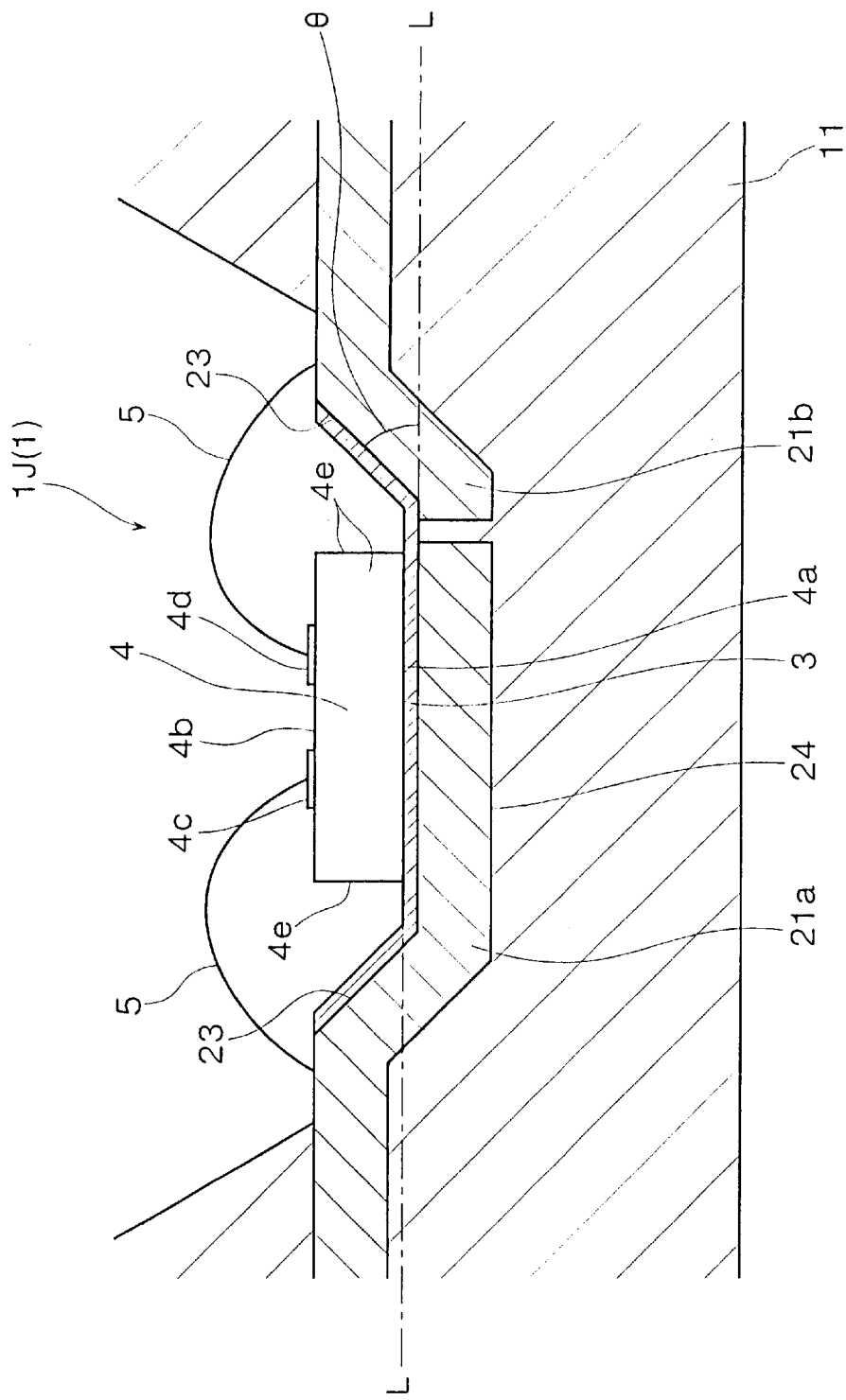
FIG. 17 is a partial sectional view showing a tenth embodiment of the light emitting device according to the invention and is a side sectional view showing the light emitting device where an inclined face is provided in a lead frame, a board or a case.
Figure 18:
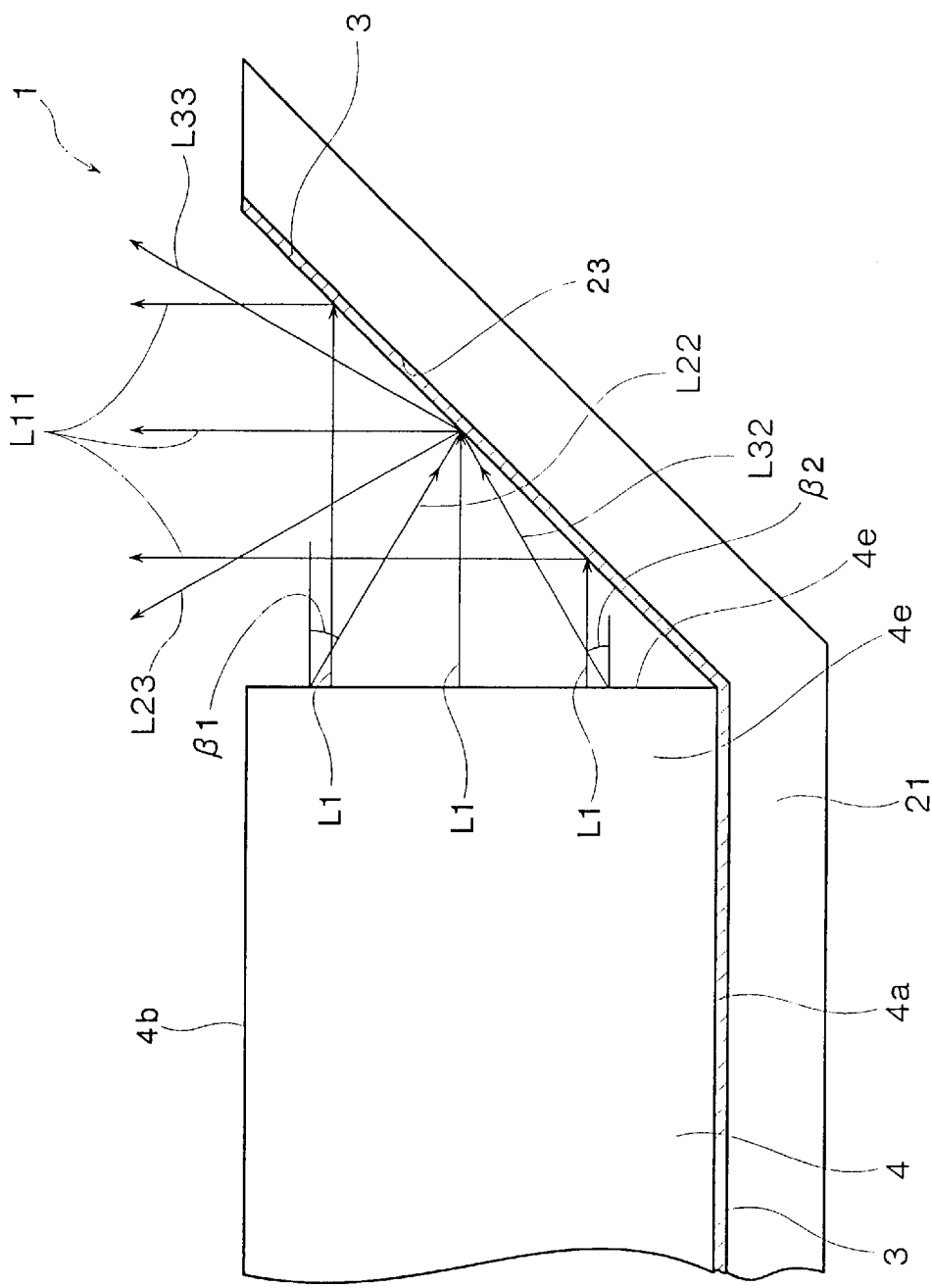
FIG. 18 shows a path of light reflected on a reflecting surface after a wavelength is converted by a wavelength converting material in a transparent resin in the configuration of the tenth embodiment of the light emitting device according to the invention.

FIG. 17 is a partial sectional view showing a tenth embodiment of the light emitting device according to the invention. FIG. 18 shows a path of the light at the inclined face emitted from the semiconductor luminous element in the light emitting device equivalent to the tenth embodiment. The same numbers designate the components similar to those of the light emitting device 1H equivalent to the eighth embodiment, and the detailed description is omitted.

A light emitting device 1J (1) equivalent to the tenth embodiment shown in FIG. 17 is provided with the lead frame 21, the transparent resin 3, the semiconductor luminous element 4 and the case 7 as in the light emitting device 1I equivalent to the ninth embodiment.

The light emitting device 1J (1) is different from the light emitting device 1I in that the inclined faces 23 are provided on the lead frame 21 at positions respectively facing the four sides 4e of the semiconductor luminous element 4.

To explain further in detail, the inclined faces 23 are situated at the outside of a contour of the lower surface 4a of the semiconductor luminous element 4 shown in FIG. 18 or the outside of a contour of the lower surface 4a of the semiconductor luminous element 4 shown in FIG. 17, and extend upward and toward outside.

It is desirable that an angle α between the inclined face 23 and a virtual extended line (an L—L line shown by an projected line in FIG. 17) of the lower surface 4a from the contour of the lower surface 4a of the semiconductor luminous element 4 is larger than 0° and is equal to/smaller than 45°, and the inclined face extends toward outside and upward. In FIGS. 17 and 18, the inclination α of the inclined face 23 is 45°. Hereby, the light emanating from the four sides 4e of the semiconductor luminous element 4 can be efficiently reflected upward.

The transparent resin 3 is maintained at a constant quantity by application or printing. The transparent resin 3 is provided on the lead frame 21 as shown in FIG. 17 up to a position above the inclined face 23 opposite to the side 4e of the semiconductor luminous element 4 in an area larger than the size of the semiconductor luminous element 4 including the area 24 in which the semiconductor luminous element 4 is mounted. Hereby, the light radiated from the semiconductor luminous element 4 can be more efficiently converted in color. Even if the quantity of the wavelength converting material by printing and others is small, the optimum tone can be acquired.

Referring to FIG. 18, the path of light will be described below.

The wavelength of the light radiated downward from the lower surface 4a of the semiconductor luminous element 4 is converted by the wavelength converting material in the transparent resin 3. A part of the converted light is radiated toward the semiconductor luminous element 4. The other part of the converted light is reflected on the wiring pattern 21a of the lead frame 21. The reflected light is also radiated toward the semiconductor luminous element 4. The light is transmitted through the semiconductor luminous element 4 and is mixed with the light directly radiated upward from the semiconductor luminous element 4.

A beam L22 passing downward from the side 4e of the semiconductor luminous element 4 is converted by the wavelength converting material included in the transparent resin 3 provided on the inclined face 23. The beam L22 is reflected at an angle equal to an angle of incidence from the side 4e of the semiconductor luminous element 4. The beam is mixed with a beam L1 emitted in a horizontal direction from the side 4e of the semiconductor luminous element 4 and a beam L11 passing upward.

In the case of the light emitting device 1J in which the inclined face 23 is provided, the beam L1 passing in the right angle relative to the side 4e is reflected at an angle of 45° at the inclined face 23 having the inclination of 45° as shown in FIG. 18. The reflected beam L11 goes vertically upward (in the right angle relative to an imaginary surface parallel to the upper surface 4b).

As shown in FIG. 18, different from the beam L1 passing from the side 4e, for example, a wavelength of a beam L22 passing downward at an angle β1 of approximately 30° is converted by the wavelength converting material in the transparent resin 3, and is reflected at the inclined face 23 having the inclination of 45°. The converted and reflected beam L23 passes upward slightly near to the semiconductor luminous element 4.

Similarly, different from the beam L1 passing from the side 4e, a wavelength of a beam L32 passing upward at an angle β of approximately 30° is converted by the wavelength converting material in the transparent resin 3, and is reflected at the inclined face 23 having the inclination of 45°. The converted and reflected beam L33 passes above the semiconductor luminous element 4 slightly apart from the semiconductor luminous element 4.

Therefore, a quantity of the beams L1 and L32 except the beam passing downward from the side 4e is equivalent to approximately 84% of the total quantity of all beams outgoing from the side 4e. Therefore, the light with good tone and luminance can be acquired by using the light from the side 4e.

As described above, the wavelength of the light outgoing from the four sides 4e of the semiconductor luminous element 4 is converted by the wavelength converting material in the transparent resin 3 provided on the inclined faces 23 of the lead frame 21 corresponding to the positions of the four sides 4e of the semiconductor luminous element 4. Afterward, the light is reflected vertically upward by the inclined faces 23. The reflected light is mixed with the direct light from the semiconductor luminous element 4 and the reflected light reflected at the inclined faces 23 without being converted in the wavelength. The reflected light is radiated outside from the upper surface of the semiconductor luminous element 4 as the mixed color (for example, the white light).

In FIGS. 15 to 18, the configuration is described in which the transparent resin 13 is provided in the larger area than the area 24 in which the semiconductor luminous element 4 is mounted on the lead frame 21. However, in place of the lead frame 21 as the base member on which the transparent resin 3 is provided, the board 11 shown in FIGS. 19 and 20 and the case 7 shown in FIGS. 21 and 22 may be also used.

Embodiment 11

Figure 19:
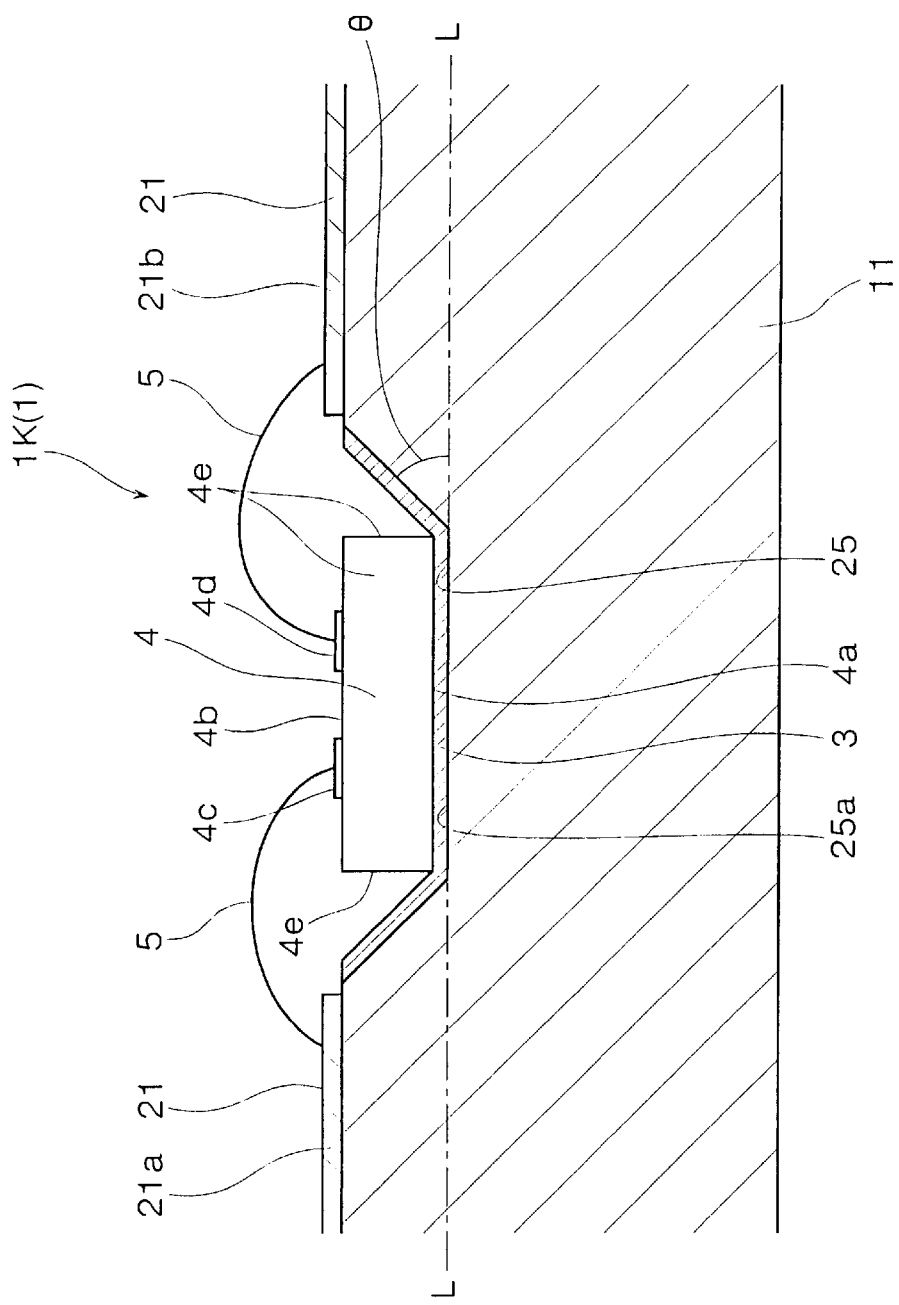
FIG. 19 is a partial side sectional view showing an eleventh embodiment of the light emitting device according to the invention.

FIG. 19 is a partial sectional view showing an eleventh embodiment of the light emitting device according to the invention. The same numbers designates the components substantially similar to those of the light emitting device 1J equivalent to the tenth embodiment, and the detailed description is omitted.

In a light emitting device 1K (1) shown in FIG. 19, a rectangular concave portion 25 is formed on a surface of the board 11. The bottom of the concave portion 25 forms the smooth surface 24 on which the semiconductor luminous element 4 is mounted. This surface 24 has the similar or larger area to/than the area of the lower surface 4a of the semiconductor luminous element 4. The peripheral wall of the concave portion 25 is opposite to the four sides 4e of the semiconductor luminous element 4, and forms the inclined faces 23 similar to those of the light emitting device 1J equivalent to the tenth embodiment.

The transparent resin 3 is formed in the concave portion 25 on the board 11 by application or printing, and is maintained at a constant quantity. The area of the transparent resin 3 is larger than the area of the lower surface 4a of the semiconductor luminous element 4 as shown in FIG. 19. The lower surface 4a of the semiconductor luminous element 4 is bonded on a flat surface 25a of the concave portion 25 via the transparent resin 3 so as to be included in the transparent resin 3.

Figure 20:
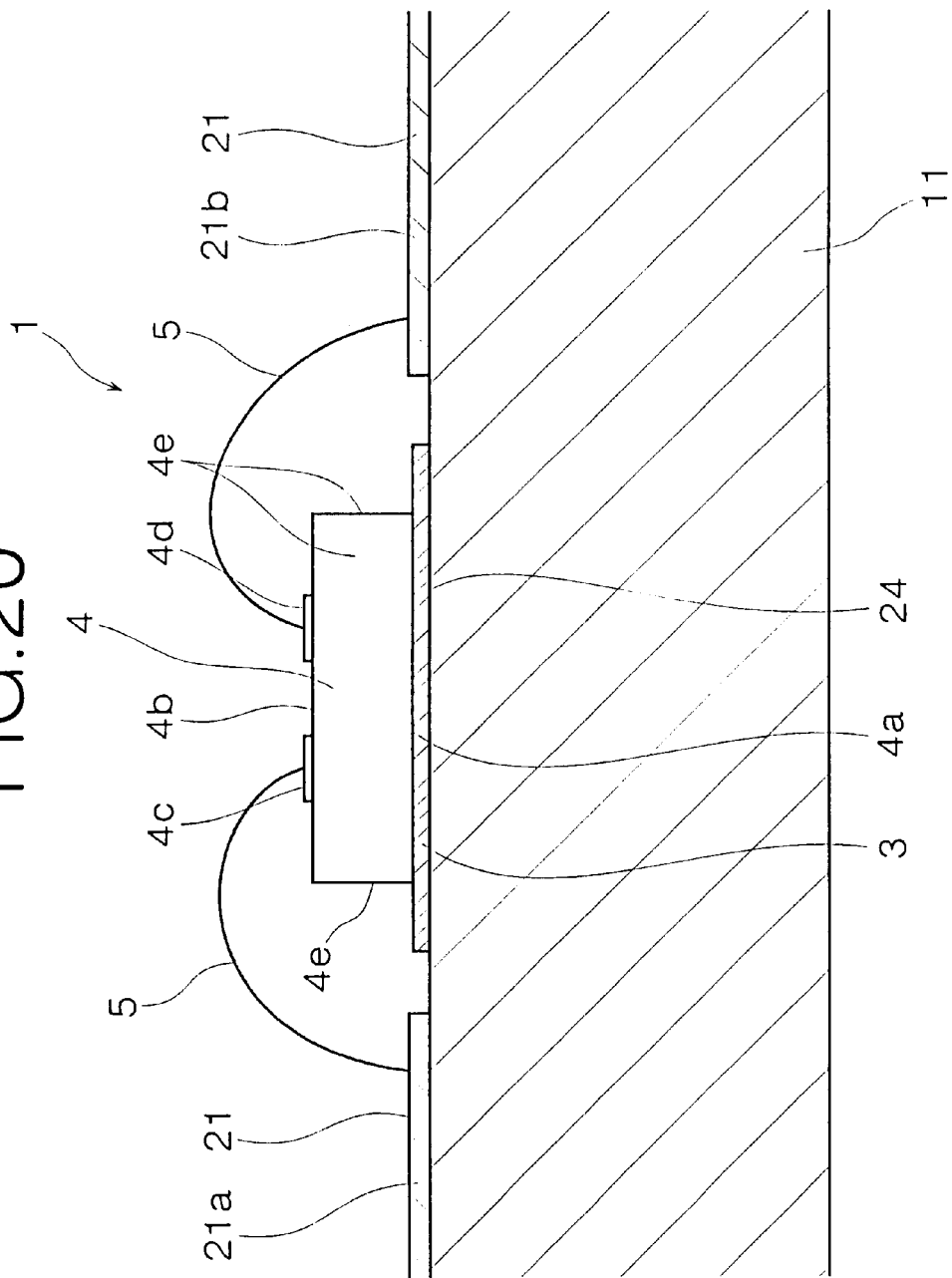
FIG. 20 is a partial side sectional view showing a modified example of the light emitting device of the eleventh embodiment.

The above-mentioned light emitting device 1K may also have a configuration that no concave portion 25 is formed in the board 11 as shown in FIG. 20. In this case, the transparent resin 3 is provided on the board 11. The area of the transparent resin 3 is larger than the area of the lower surface 4a of the semiconductor luminous element 4. The lower surface 4a of the semiconductor luminous element 4 is bonded on the board 11 via the transparent resin 3 so as to be included in the transparent resin 3.

Embodiment 12

Figure 21:
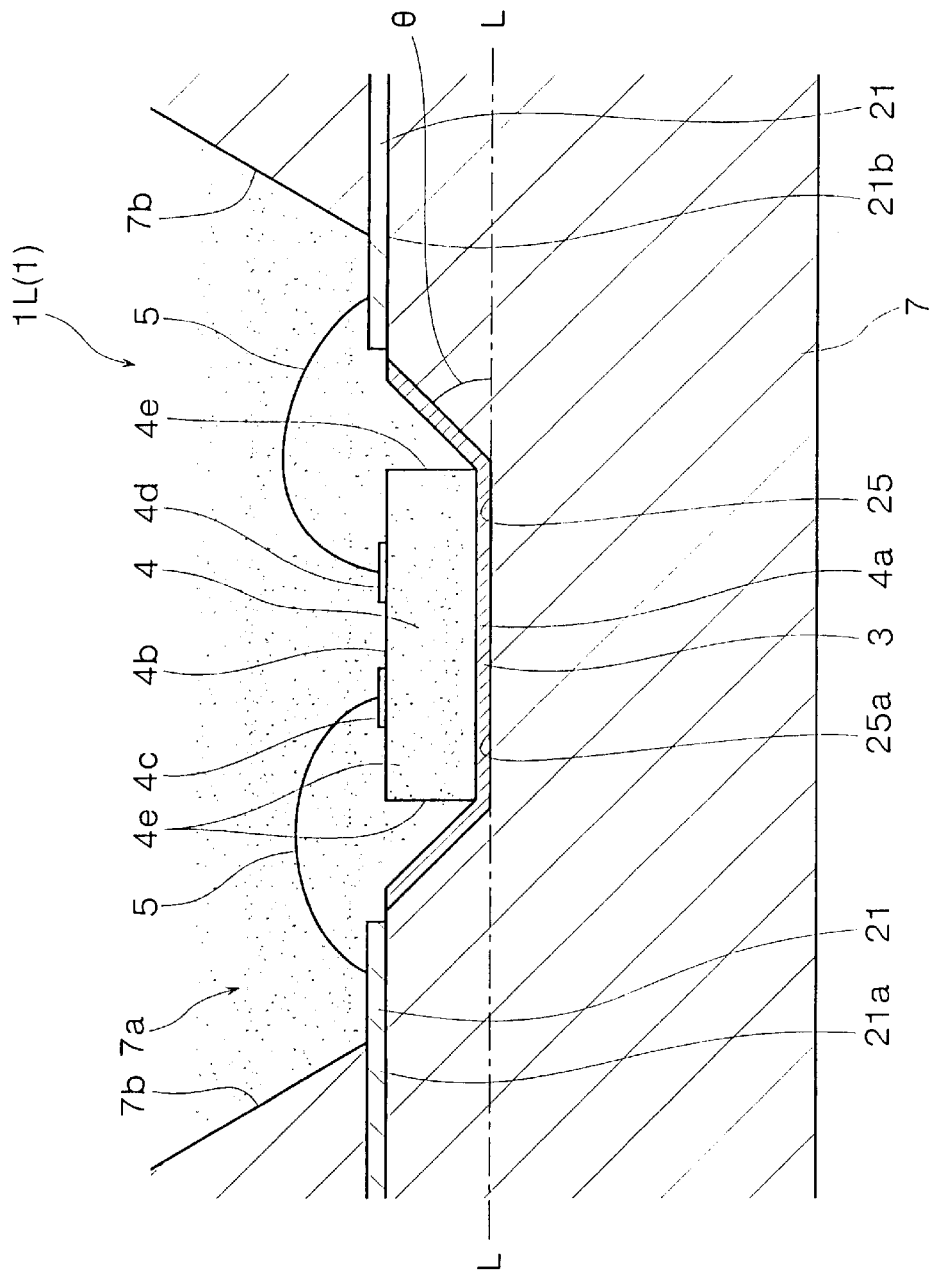
FIG. 21 is a partial side sectional view showing a twelfth embodiment of the light emitting device according to the invention.

FIG. 21 is a partial sectional view showing a twelfth embodiment of the light emitting device according to the invention. The same numbers designate the components substantially similar to those of the light emitting device 1J equivalent to the tenth embodiment, and the detailed description is omitted.

In a light emitting device 1L (1) shown in FIG. 21, the rectangular concave portion 25 is formed at the bottom of the concave portion 7a of the case 7. The bottom of the concave portion 25 forms the smooth surface 24 on which the semiconductor luminous element 4 is mounted. This surface 24 has the similar or larger area to/than the area of the lower surface 4a of the semiconductor luminous element 4. The peripheral wall of the concave portion 25 is opposite to the four sides 4e of the semiconductor luminous element 4 and forms the inclined faces 23 similar to those of the light emitting device 1J equivalent to the tenth embodiment.

The transparent resin 3 is formed on the concave portion 25 of the case 7 by application or printing, and is maintained at a constant quantity. The area of the transparent resin 3 is larger than the area of the lower surface 4a of the semiconductor luminous element 4 as shown in FIG. 21. The lower surface 4a of the semiconductor luminous element 4 is bonded on the flat surface 25a of the concave portion 25 via the transparent resin so that the lower surface 4a is included in the transparent resin 3.

Figure 22:
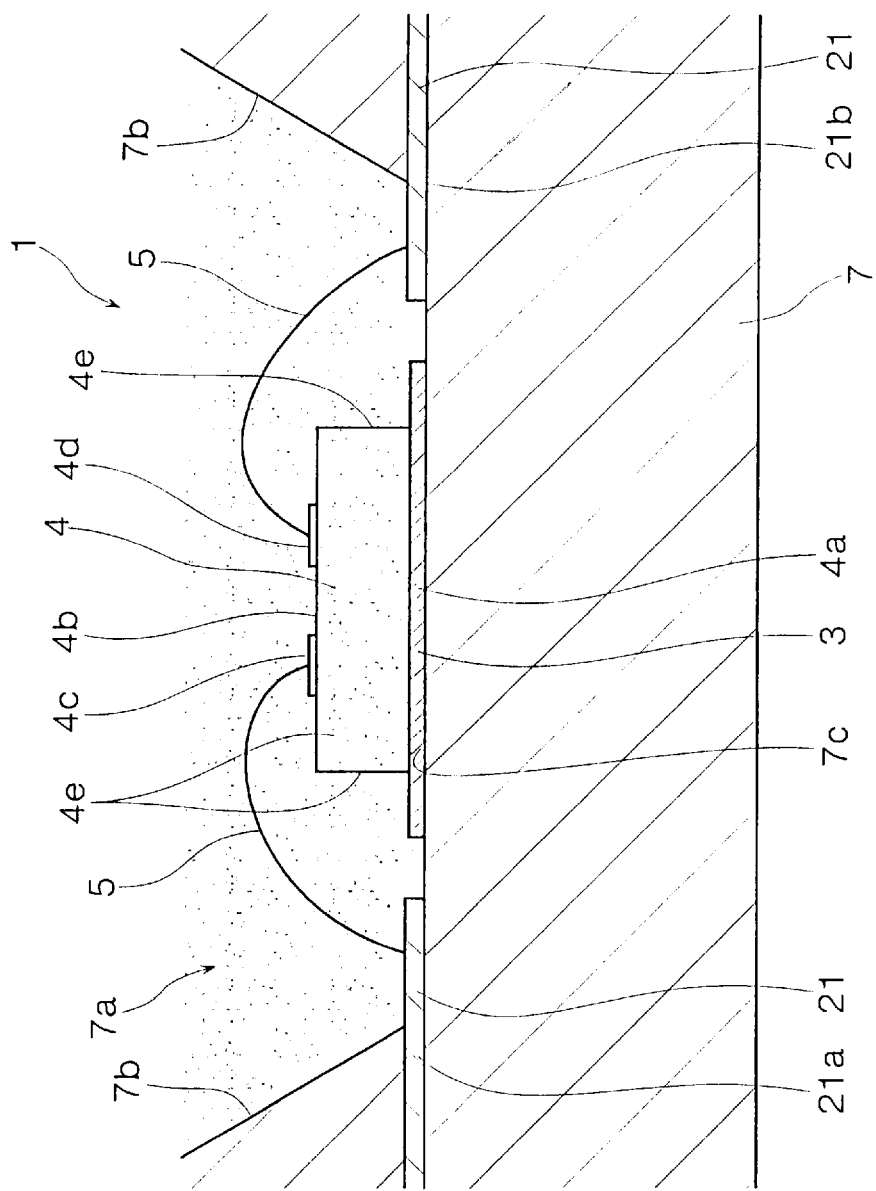
FIG. 22 is a partial side sectional view showing a modified example of the light emitting device of the twelfth embodiment.

The above-mentioned light emitting device 1L may also have a configuration that no concave portion 25 is formed in the concave portion 7a of the case 7 as shown in FIG. 22. In this case, the transparent resin 3 is provided on the flat surface 7c of the concave portion 7a of the case 7. The area of the transparent resin 3 is larger than the area of the lower surface 4a of the semiconductor luminous element 4. The lower surface 4a of the semiconductor luminous element 4 is bonded on the flat surface 7c of the case 7 via the transparent resin 3 so as to be included in the transparent resin 3.

As described above, in the light emitting device 1 equivalent to this embodiment, the semiconductor luminous element 4 is bonded and fixed by the transparent resin 3 in which the wavelength converting material (or wavelength converting material and conductive material) is (are) mixed on the base member having reflectivity (a reflective board 11, a reflective lead frame 21, a reflective pattern and a reflective electric wiring pattern in the case 7). Hereby, the wavelength of the light outgoing from the surface (the lower surface 4a, the side faces 4e) except the upper surface 4b of the semiconductor luminous element 4 is converted by the wavelength converting material (or the wavelength converting material and the conductive material) in the transparent resin 3. The converted light is transmitted in the semiconductor luminous element 4 again and is outgoing from the upper surface 4b as the mixed light.

To acquire the white light, the semiconductor luminous element that emits the blue light is used for the semiconductor luminous element 4. For the transparent resin 3, the resin in which the wavelength converting material (or wavelength converting material and conductive material) including the orange fluorescent pigment or the orange fluorescent dye is (are) mixed is used. Hereby, the blue light from the semiconductor luminous element 4 itself is radiated upward from the semiconductor luminous element 4. The blue light radiated downward from the semiconductor luminous element 4 is reflected toward the semiconductor luminous element 4 again as the yellow light converted by the wavelength converting material in the transparent resin 3. Further, the blue light radiated upward from the semiconductor luminous element 4 and the yellow light reflected toward the semiconductor luminous element 4 are completely mixed, and the uniform white light is radiated from the upper surface of the semiconductor luminous element 4. As a result, when the wavelength converting material (a color converting member) is evenly distributed, the clear and high-luminance white light can be acquired.

Particularly, as shown in FIGS. 17 and 18, according to the light emitting device provided with the inclined faces 23 opposite to the four sides 4e of the semiconductor luminous element 4, the wavelength of most of the light from the lower surface 4a of the semiconductor luminous element 4 and the four sides 4e of the semiconductor luminous element 4 is converted by the wavelength converting material in the transparent resin 3 formed between the lower surface 4a of the semiconductor luminous element 4 and the inclined faces 23. The light is reflected toward the semiconductor luminous element 4. As the blue light from the upper surface 4b of the semiconductor luminous element 4 and the reflected yellow light outgoing from the lower surface 4a and the sides 4e and converted in the wavelength are mixed, the white light can be acquired. Hereby, the light emitting device excellent in color tone and satisfactory in lightening, economy and downsizing can be acquired.

As described above, the light emitting device according to the invention is used for a light source for a lamp and a display. The light emitting device is useful for a light source for a liquid crystal display, a mobile telephone, portable terminal equipment, small-sized terminal equipment and others.

What is claimed is:

1. A light emitting device, comprising:
   a base member;
   a reflecting surface formed on the base member;
   a transparent resin provided on the reflecting surface and containing a wavelength converting material therein; and
   a transparent semiconductor luminous element provided on the transparent resin and having a lower surface and an upper surface for emitting light, said semiconductor luminous element emitting the light upwardly without wavelength conversion, and downwardly to convert by the wavelength converting material a wavelength of the light emitted from the lower surface of the semiconductor luminous element, one part of the light emitted downwardly being converted by the wavelength converting material to orient upwardly and the other part of the light emitted downwardly and converted being reflected on the reflecting surface to orient upwardly, the one and the other parts of the light converted by the wavelength converting material and oriented upwardly being mixed with the light directly emitted from the upper surface of the semiconductor luminous element to emit white light.

2. A light emitting device according to claim 1, wherein said transparent resin further contains a conductive material.

3. A light emitting device according to claim 1, wherein the transparent resin is formed in a larger area than an area of the semiconductor luminous element on the base member; and the semiconductor luminous element is bonded and fixed on the transparent resin on the base member.

4. A light emitting device according to claim 1, wherein the base member is made of at least one material selected from the group consisting of a ceramic board, a liquid crystal polymer resin board, a glass fiber epoxy resin board, a lead frame and a reflective case.

5. A light emitting device according to claim 1, wherein the semiconductor luminous element is made of at least one material selected from the group consisting of InGaAlP, InGaAlN, InGaN and GaN.

6. A light emitting device according to claim 1, wherein said semiconductor luminous element emits blue light and said wavelength converting material converts the blue light to yellow light so that the blue light and the yellow light are mixed to emit the white light.

7. A light emitting device according to claim 1, wherein said base member has a concave portion; the transparent resin is filled in the concave portion; and the semiconductor luminous element is bonded and fixed on the transparent resin filled in the concave portion.

8. A light emitting device according to claim 7, wherein the concave portion has an inner wall opposite to a side of the semiconductor luminous element; and the inner wall is an inclined face that extends from a bottom of the concave portion toward an aperture of the concave portion.

9. A light emitting device according to claim 8, wherein said inclined face of the concave portion is inclined relative to the bottom of the concave portion at an angle larger than 0° and equal to or smaller than 45°.

10. A light emitting device according to claim 7, wherein the concave portion has an aperture having an area smaller than an area of the lower surface of the semiconductor luminous element.

11. A light emitting device according to claim 10, wherein the aperture of the concave portion is formed in a shape of the light emitted from the semiconductor luminous element, which is a rectangular shape or a circular shape.

12. A light emitting device according to claim 1, wherein the semiconductor luminous element is bonded and fixed on the transparent resin by a transparent adhesive.

13. A light emitting device according to claim 12, wherein the semiconductor luminous element is provided with a transparent electrode on the lower surface; and the transparent electrode is provided on an active layer formed on a transparent board.

\* \* \* \* \*